(12) United States Patent
Dervisoglu et al.

(10) Patent No.: US 7,181,705 B2
(45) Date of Patent: Feb. 20, 2007

(54) HIERARCHICAL TEST CIRCUIT STRUCTURE FOR CHIPS WITH MULTIPLE CIRCUIT BLOCKS

(75) Inventors: Bulent Dervisoglu, Mountain View, CA (US); Laurence H. Cooke, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/327,369

(22) Filed: Dec. 20, 2002

(65) Prior Publication Data

US 2003/0131327 A1 Jul. 10, 2003

Related U.S. Application Data

(63) Continuation-in-part of application No. 09/839,602, filed on Apr. 19, 2001, now Pat. No. 6,631,504, and a continuation-in-part of application No. 09/765,958, filed on Jan. 18, 2001.
(60) Provisional application No. 60/176,879, filed on Jan. 18, 2000.

(51) Int. Cl.
*G06F 17/50* (2006.01)

(52) U.S. Cl. .................. 716/4; 716/5; 716/8; 716/10
(58) Field of Classification Search ............ 716/4, 716/1–3, 5–15; 714/724–730; 703/726
See application file for complete search history.

(56) References Cited

U.S. PATENT DOCUMENTS

| | | | |
|---|---|---|---|
| 4,354,268 A | 10/1982 | Michael et al. | |
| 4,872,169 A | 10/1989 | Whetsel, Jr. | |
| 5,428,624 A | 6/1995 | Blair et al. | |

(Continued)

FOREIGN PATENT DOCUMENTS

EP 0 466 939 A1 1/1992

OTHER PUBLICATIONS

Bulent Dervisoglu et al., "A Novel Approach for Designing Hierarchical Test Access Controller for Embedded Core Designs in an SoC Environment", 4$^{th}$ IEEE International Workshop of Testing Embedded Core–based System–Chips, pp. 1.4–1 to 1.4–7, May 3–4, 2000, Montreal, Canada.
Bulent Dervisoglu, "A Unified DFT Architecture for use with IEEE 1149.1 and VSIA/IEEE P1500 Compliant Test Access Controllers", *DAC 2001*, Jun. 18–22, 2001, Las Vegas, NV, pp. 53–58.

(Continued)

*Primary Examiner*—Vuthe Siek
*Assistant Examiner*—Magid Y. Dimyan
(74) *Attorney, Agent, or Firm*—Bingham McCutchen LLP

(57) ABSTRACT

A system and method for testing an integrated circuit having internal circuit blocks. Each of the internal circuit blocks may have its own test circuit block, referred to as a socket access port. The integrated circuit preferably includes a chip access port (e.g., an IEEE standard 1149.1 compliant test access port) connected to a set of boundary-scan cells, and connected in a hierarchical fashion to the lower-level test circuit blocks. Each of the lower-level test control circuit blocks preferably comprises a socket access port controller, and test operation is transferred downward and upwards within said hierarchical structure by communicating from a test control circuit block to the test control circuit block at the immediately higher or immediately lower level in the hierarchical structure. Each of the lower-level test control circuit blocks of the hierarchical test control network may be functionally identical. Further, each of the lower-level test control circuit blocks may be structurally identical. An existing boundary scan may be easily modified for use in the hierarchical structure by adding push instructions to send it to a lower-level test circuit block, and pop instructions to return control to the higher level test circuit block.

37 Claims, 15 Drawing Sheets

U.S. PATENT DOCUMENTS

| | | |
|---|---|---|
| 5,477,548 A | 12/1995 | Beenker et al. |
| 5,513,189 A | 4/1996 | Savage |
| 5,627,842 A | 5/1997 | Brown et al. |
| 5,701,309 A | 12/1997 | Gearhardt et al. |
| 5,774,474 A | 6/1998 | Narayanan et al. |
| 5,828,824 A | 10/1998 | Swoboda |
| 6,000,051 A | 12/1999 | Nadeau-Dostie et al. |
| 6,012,155 A | 1/2000 | Beausang et al. |
| 6,115,763 A | 9/2000 | Douskey et al. |
| 6,173,428 B1 | 1/2001 | West |
| 6,191,603 B1 | 2/2001 | Muradali et al. |
| 6,269,467 B1 | 7/2001 | Chang et al. |
| 6,286,128 B1 | 9/2001 | Pileggi et al. |
| 6,292,929 B2 | 9/2001 | Scepanovic et al. |
| 6,311,302 B1 | 10/2001 | Cassetti et al. |
| 6,378,090 B1 | 4/2002 | Bhattacharya |
| 6,378,093 B1 | 4/2002 | Whetsel |
| 6,381,717 B1 | 4/2002 | Bhattacharya |
| 6,408,413 B1 | 6/2002 | Whetsel |
| 6,456,961 B1 | 9/2002 | Patil et al. |
| 6,587,981 B1 | 7/2003 | Muradali et al. |
| 6,631,504 B2 | 10/2003 | Dervisoglu et al. |

OTHER PUBLICATIONS

Lee Whetsel, "An IEEE 1149.1 Based Test Access Architecture For IC's With Embedded Cores", *Proceedings International Test Conference 1997*, pp. 69–78.

Debashis Bhattacharya, "Hierarchical Test Access Architecture for Embedded Cores in an Integrated Circuit", *Proceedings 16$^{th}$ IEEE VLSI Test Symposium*, Apr. 26–30, 1998, pp. 8–14.

Debashis Bhattacharya, "Instruction–Driven Wake–Up Mechanisms for Snoopy TAP Controller", *Proceedings 17$^{th}$ IEEE VLSI Test Symposium*, Apr. 25–29, 1999, pp. 467–472.

HIERARCHICAL TEST CIRCUIT STRUCTURE FOR CHIPS WITH MULTIPLE CIRCUIT BLOCKS

CROSS REFERENCE TO RELATED APPLICATIONS

This application is a continuation-in-part of U.S. application Ser. No. 09/839,602 filed Apr. 19, 2001, now U.S. Pat. No. 6,631,504, issued Oct. 7, 2004, and co-pending U.S. application Ser. No. 09/765,958 filed on Jan. 18, 2001, now U.S. Pat. No. 6,886,121, issued Apr. 26, 2005, which claims priority to U.S. Provisional Application Ser. No. 60/176,879 filed on Jan. 18, 2000, of which applications are hereby incorporated by reference as if set forth fully herein.

STATEMENT PURSUANT TO 37 CFR 1.71(E)

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The field of the present invention generally relates to electronic design automation and testing of integrated circuits, and, more particularly, to methods and systems for testing circuit blocks in multi-block chip designs.

2. Background

Chip designers often use electronic design automation (EDA) software tools to assist in the design process, and to allow simulation of a chip design prior to prototyping or production. Chip design using EDA software tools generally involves an iterative process whereby the chip design is gradually perfected. Typically, the chip designer builds up a circuit by inputting information at a computer workstation generally having high quality graphics capability so as to display portions of the circuit design as needed. A top-down design methodology is commonly employed using hardware description languages (HDLs), such as Verilog® or VHDL, for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions) using specialized placement and routing software, resulting in a physical layout file. A mask file, for example a GDSII or CIF format, may be provided to a foundry, and contains enough information to allow the foundry to manufacture an actual integrated circuit therefrom.

At various stages of the design process, validation of the design may be desired through test or verification procedures. To test a design, a set of test vectors is ordinarily generated which will be applied to the inputs to the design and compared against the outputs of the design. An error in the design will be indicated if the actual output generated by the design does not match the expected output. A test access port (TAP) is usually provided on-chip for receiving input test data from a test data source and outputting output test data from the integrated circuit. The test access port is generally used for testing an integrated circuit during and after the manufacturing of the integrated circuit. Another common use of the test access port is on a printed circuit board (PCB) where interconnectivity between multiple components (ICs) can be verified in addition to testing the individual components (ICs). The test access port is generally connected to a serially linked set of boundary-scan cells, one such cell for each input and output pin of the integrated circuit. The test access port controls the inflow and outflow of information with respect to the boundary-scan cells, and hence with respect to the integrated circuit core.

Test and verification processes are facing new challenges due to changes in integrated circuit (IC) design. In particular, decreases in the feature size of circuit elements has led to the ability to place more components on a single integrated circuit. At the same time, decreases in design cycle time are being sought, in order to allow faster time-to-market and hence a potential competitive advantage. Due in part to these trends, the current trend in integrated circuit core design is to create more and more complex cores capable of being stored on a single IC. Design cores that were previously whole ICs have now been reduced to sizes allowing their use as individual components of complex ICs containing multiple design cores.

Another trend in the integrated circuit design industry is to reuse pre-existing circuit blocks in a new design, particularly in multi-core integrated circuits, in order to reduce the development time of an integrated circuit. The pre-existing circuit blocks may be "soft" or "hard", or somewhere in between. A "soft" circuit block is one that has not been physically laid out, while a "hard" circuit block has its physical layout already determined (i.e., placement and routing of its internal components has been achieved). Pre-existing circuit blocks may occasionally be referred to as "VCs" (short for "Virtual Components") or "IPs" (short for "Intellectual Properties," suggesting their proprietary nature to particular designers). Often, pre-existing circuit blocks will include their own individual test access port to allow testing of the IP itself, assuming the test access port is accessible through chip-level pins after the pre-existing circuit block is placed in a larger integrated circuit design.

A conventional approach to complex IC design involves system development using pre-existing circuit cores (e.g., VCs or IPs) which have already been individually tested using manufacturer developed test vectors. Often, a basic IC platform is developed, and as the design functionality is expanded, more pre-existing circuit cores are added to the hierarchy of the design. Reuse of pre-existing integrated circuit cores generally raises the possibility of using the existing manufacturing level test vectors to further reduce total design and verification time. Investing time in developing new test vectors when test vectors already exist for a given virtual component block would defeat the goal of reducing the time-to-market through partial design reuse. This is particularly true if the reused virtual component block is already hardened, leaving little or no room to generate different test vectors.

As the design size and complexity of integrated circuits has increased, the time necessary to develop manufacturing level test vectors has also increased significantly, causing increased delays in delivering the chips to market. To complicate matters further, the widely accepted IC test standard, Standard 1149.1 promulgated by the Institute of Electrical and Electronics Engineers (IEEE), cannot be used directly in ICs containing embedded cores with built-in test access ports. The 1149.1 standard was formulated with the goal of allowing one test access port per chip, and does not take into account the possibility of chip designs containing multiple embedded cores, some of which may already have built-in 1149.1 compliant test access ports. This problem is becoming increasingly significant as the 1149.1 test standard has reached widespread acceptance in the electronics and semiconductor industries, making it highly desirable that current and future ICs be fully compliant with the standard.

Use of existing or even new test vectors to test the individual cores inside multi-core integrated circuits poses difficult challenges because the individual cores are embedded within the chip, with limited or no direct pin access exterior to the chip itself. When the multi-core integrated circuits are manufactured, only necessary external connectivity is maintained; therefore, many of the pins of the of the individual circuit blocks are partially or completely inaccessible from outside the chip. Because external connectivity to each pin of the individual circuit blocks cannot be provided, testing individual circuit blocks by applying a set of test vectors to the manufactured multi-core integrated circuit designs can be problematic. Further, even if the circuit blocks have boundary-scan (BS) ports, and even if the test vectors are designed to test the individual circuit blocks through their boundary-scan ports, it is neither feasible nor efficient to bring the connectivity of the entire boundary-scan port of all such circuit blocks out to the edge of the chip because this would significantly increase the number of test pins at the chip level.

Another problem with testing complex ICs is that some circuit blocks may themselves be comprised of one or more internal circuit blocks, each of which also may require testing, and each of which also may be originally designed with its own design access port. The existing IEEE Standard does not adequately define a protocol suitable for testing circuit blocks internal to a larger circuit block on a chip.

Various methodologies have recently been proposed to address the difficulties associated with testing the embedded cores in complex ICs while still adhering to the IEEE 1149.1 standard. One approach, for example, is described in Lee Whetsel, "An IEEE 1149.1 Based Test Access Architecture for ICs With Embedded Cores," *Proc. International Test Conference*, 1997, pp. 69–78, hereby incorporated by reference as if set forth fully herein. The approach detailed in this article, while directed to the problems associated with testing embedded IC cores, requires modification to the existing test access port (TAP) controllers in the circuit blocks, including a large amount of logic (resulting in modified TAP controllers) at each level of core hierarchy. Other methodologies not requiring modifications to existing test access port controllers, and directed primarily to designs having pre-hardened blocks, may require the addition of a modified TAP controller (known as an HTAP) at each circuit block hierarchy level. Such an approach is described in D. Bhattacharya, "Hierarchical Test Access Architecture for Embedded Cores in an Integrated Circuit," *Proc. VLSI Test Symposium*, 16th IEEE, 1998, pp. 8–14, hereby incorporated by reference as if set forth fully herein. The aforementioned conventional approaches may require increased engineering time and effort, due to the complexity of the implementation involved, and may further require specialized software tools.

Another method for testing embedded cores in complex ICs makes use of multiplexers (MUXs) to select a desired circuit block containing the core to be tested. With this approach, the number of select pins needed for multiplexing is generally $\log_2 N$, rounded up, where N is the number of embedded cores to be tested in the design. Thus, for example, four select pins would be necessary to select one of nine circuit blocks containing an embedded core within a chip, since $\log_2 9$ rounded up is 4. While allowing access to different embedded cores, this technique can be undesirable because it requires a number of chip test pins proportional to the number of cores embedded in the integrated circuit, which becomes inefficient for complex designs containing large numbers of embedded cores.

A need thus exists for a scaleable, efficient mechanism to access embedded cores for testing in complex ICs, particularly one that is compatible with the IEEE 1149.1 standard, that requires minimal design and area overhead, and that interfaces easily with circuit blocks having pre-generated test pattern sequences.

SUMMARY OF THE INVENTION

The invention provides in one aspect a method and system for testing multiple-block integrated circuits. A preferred system and method are described that can be compatible with the IEEE 1149.1 standard test protocol.

In one embodiment as disclosed herein, a system and method are provided for testing an integrated circuit comprising one or more circuit blocks, each containing an internal core, and a chip access port (e.g., an IEEE standard 1149.1 compliant test access port) preferably connected to a set of boundary-scan cells. In one aspect, a hierarchical test control network for an integrated circuit, comprises a top-level test control circuit block with a chip access port, and a plurality of lower-level test control circuit blocks connected, directly or indirectly, to the top-level test control circuit block in a hierarchical structure. Each of the lower-level test control circuit blocks may be connected to or part of an individual circuit block within the integrated circuit design, for controlling the testing thereof. In this embodiment, each of the lower-level test control circuit blocks preferably comprises a socket access port (SAP) controller, and test operation is transferred downward and upwards within said hierarchical structure. In a particular embodiment, test operation is transferred downward and upwards within the hierarchical structure by communicating from the present-level test control circuit block to the test control circuit block at the immediately higher or immediately lower hierarchical level in the hierarchical structure.

Each of the lower-level test control circuit blocks may comprise a test mode select input port, a test data input port, and a test data output port. In such a configuration, each of the lower-level test control circuit blocks may comprise a state controller for controlling the receipt or transmission of information from or to the test mode select input port, the test data input port, and the test data output port.

Test control circuit blocks connected at the same hierarchical level may share a common test mode enable input (e.g., TME_IN) signal, a common test reset signal, a common test mode select signal, and a common clock signal, and collectively output a common test mode output (e.g., TME_OUT) signal comprising a logical OR of individual test mode data output signals output from each of the test control circuit blocks connected at the same hierarchical level. In such a configuration, each of the lower-level test control circuit blocks connected at the same hierarchical level may receive separate test mode data in signals from lower-level test control circuit blocks at an immediately lower hierarchical level, and may output separate test mode enable output signals to the lower-level test control circuit blocks at the immediately lower hierarchical level.

Each of the lower-level test control circuit blocks of the hierarchical test control network may be functionally identical. Further, each of the lower-level test control circuit blocks may be structurally identical.

In another, separate embodiment, a hierarchical test control network for an integrated circuit is provided, comprising a plurality of test control circuit blocks in a hierarchical structure having a plurality of hierarchical levels, each of the test control circuit blocks comprising a first test data input port, a second test data input port (referred to in some embodiments as TDI2), and a test data output port, at least one of the test control circuit blocks connected to a chip access port. The test control network further comprises a common test mode select signal connected to each of the test control circuit blocks, a common test reset signal connected to each of the test control circuit blocks, and a common test clock signal connected to each of the test control circuit blocks. The test control circuit blocks at the same hierarchical level are preferably connected in a chain configuration. Test control circuit blocks at the same hierarchical level preferably each receive at their test mode enable input port (e.g., TME_IN) a shared test mode enable signal from the test mode enable output port (e.g., TME_OUT) of a test control circuit block at the immediately higher hierarchical level. The test control circuit blocks in this embodiment may comprise a top-level test control circuit block having a chip access port (CAP) controller connected to the chip access port, and a plurality of lower-level test control circuit blocks, one or more of the lower-level test control circuit blocks at each of the hierarchical levels. At least one of the lower-level test control circuit blocks may be connected to the top-level test control circuit block, and each of the lower-level test control circuit blocks may comprise a socket access port (SAP) controller. Test operation may be transferred downward and upwards within the hierarchical structure by communicating from each test control circuit block to the test control circuit block at the immediately higher or immediately lower hierarchical level in said hierarchical structure.

In another, separate embodiment, a multi-functional test control circuit block is provided, which can operate within a hierarchical test control network, or else be readily configured to operate as a test port controller according to a conventional, standard protocol (such as IEEE Standard 1149.1).

Further embodiments, variations and enhancements are also described herein.

DETAILED DESCRIPTION OF PREFERRED EMBODIMENTS

Preferred embodiments of the present invention will now be described, with reference as appropriate to the accompanying drawings.

Figure 1:
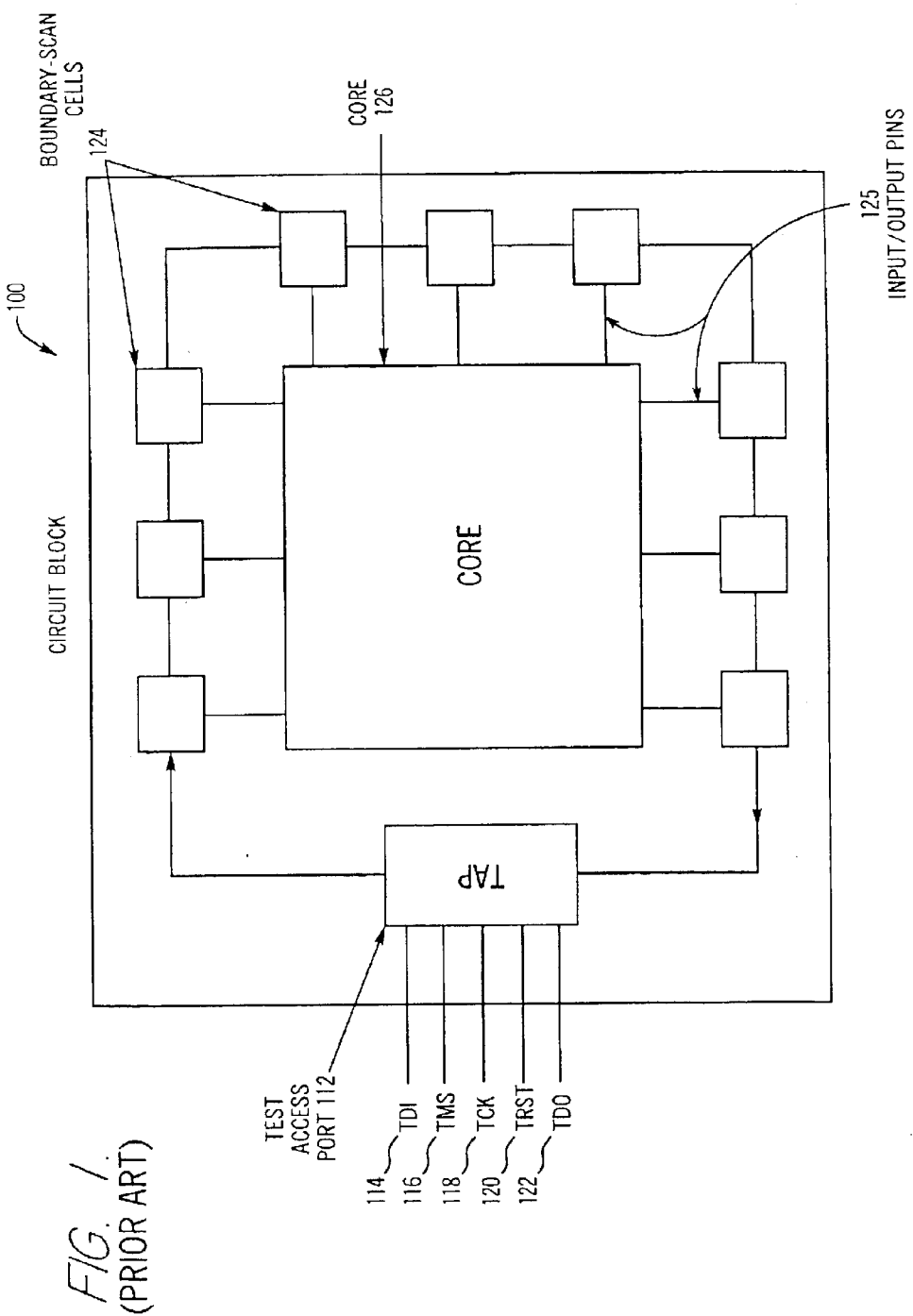
FIG. 1 is a block diagram of a typical circuit block having a core, a test access port, and boundary-scan cells.

FIG. 1 is a block diagram of a "typical" circuit block 100 containing a test access port (TAP) 112 and an embedded core 126 with boundary-scan (BS) cells 124. The circuit block 100 may comprise the entirety of a particular integrated circuit design or chip. The test access port 112 in this example may be a general purpose test access port, based on the IEEE Standard 1149.1 described in IEEE Computer Society, "IEEE Standard Test Access Port and Boundary-Scan Architecture," 1149.1–1990 (including IEEE Std. 1149.1a–1993 and any subsequent additions or modifications), published by the Institute of Electrical and Electronics Engineers, Inc., hereby incorporated by reference as if set forth fully herein. The test access port 112 according to IEEE Standard 1149.1 includes several (four or five) dedicated test signal pins: a Test Clock (TCK) signal 118, a Test Mode Select (TMS) signal 116, a Test Data Input (TDI) signal 114, a Test Data Output (TDO) signal 122, and an optional Test Reset (TRST) signal 120. The test access port signals 114, 116, 118, 120 and 122 control a sixteen-state finite state machine generally referred to as a test access port controller finite state machine (FSM) (not shown) that operates according to the state diagram described in the aforementioned IEEE Standard 1149.1 article.

The circuit block 100 will usually include the major part of a chip, and might, depending upon the nature of the chip, be used independently or may be intended for use within another larger system. The boundary-scan cells 124 are placed between the test access port 112 and the internal core 126 to control and/or observe signal values present at each input/output pin 125 connecting the boundary-scan cells to the internal core 126. Generally, one boundary-scan cell 124 will be provided for each input/output pin 125 of the internal core 126. The boundary-scan cells 124 are typically connected in series so as to form a scan chain, and may, when so arranged, be collectively referred to as boundary-scan registers or a boundary-scan chain.

To test the embedded core 126, test vectors may be scanned into the boundary-scan registers 124 serially through the test access port 112 so that test stimuli are applied in parallel to the internal core 126 through the input/output pins 125. The response of the core 126 is then captured in parallel by the boundary-scan registers 124. The captured responses are then scanned out serially through the test access port 112.

Figure 2:
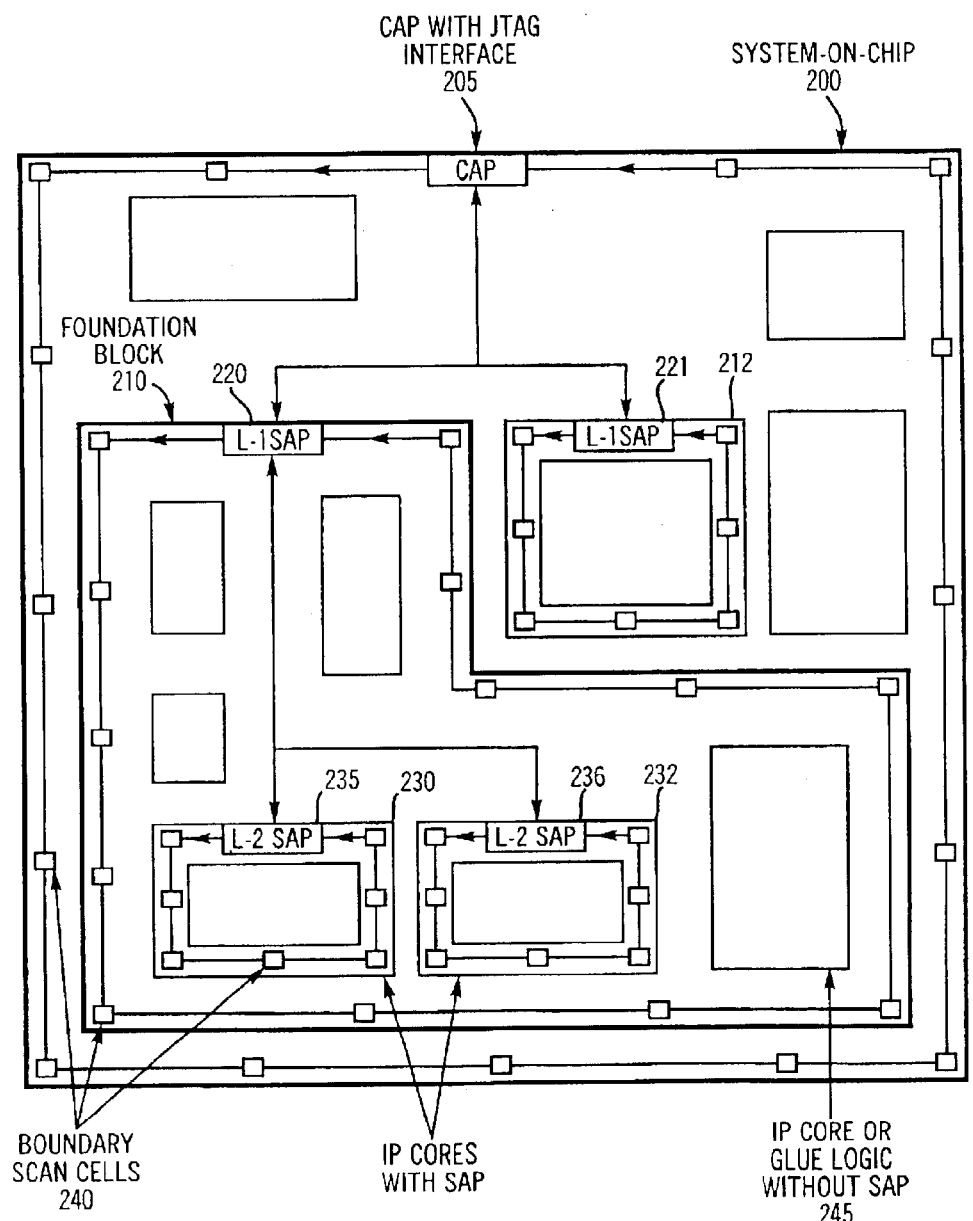
FIG. 2 is high-level diagram illustrating a hierarchical test circuit architecture in accordance with one embodiment as disclosed herein.
Figure 3:
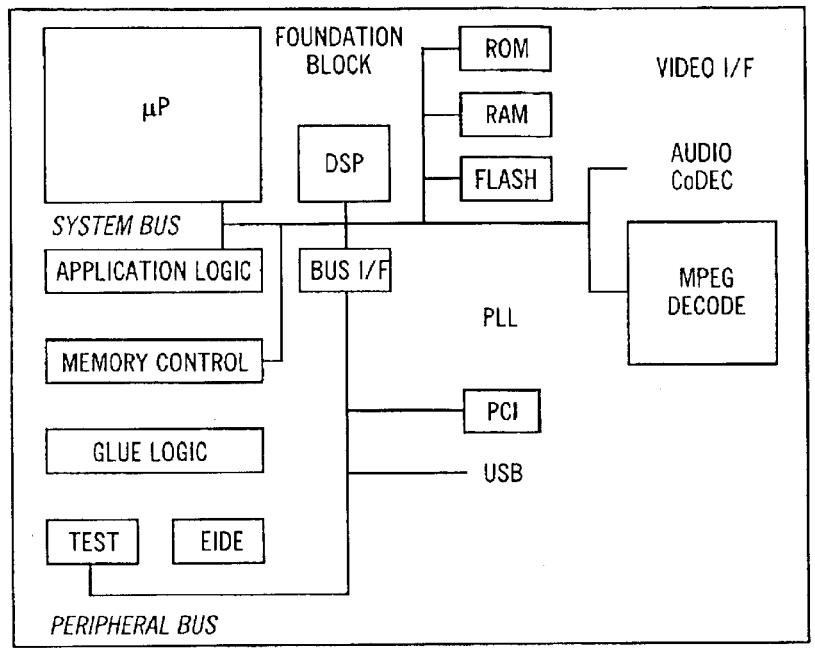
FIG. 3 is a block diagram of one example of a foundation block.

FIG. 2 is high-level diagram illustrating a hierarchical test circuit architecture in accordance with one embodiment as disclosed herein. As shown in FIG. 2, a chip 200 (which, as in this example, may comprise a "system on chip" formed of multiple virtual circuit blocks) may comprise a foundation block 210 and various other peripheral circuit blocks, such as, e.g., circuit block 212. The foundation block 210 generally contains the primary control logic of the chip 200, and often contains programmable functionality so that it can be re-used in and/or adapted for different chip designs. An example of a foundation block is illustrated in FIG. 3. The foundation block 210 may itself internally comprise other virtual circuit blocks, such as, for example, virtual circuit blocks 230 and 232. The chip 200 shown in FIG. 2 comprises a top-level test circuit block, referred to as a chip access port (CAP) 205, which acts as a test interface between the internals of the chip 200 and the external world.

The chip access port 205 can be used to provide access to test features such as an internal scan or a built-in self test (BIST) during component testing using automatic test equipment and while debugging. It is used for the purpose of gaining access to internal test features of the foundation block 210 as well as other testable peripheral circuit blocks, such as, e.g., circuit block 212. The chip access port 205 itself comprises a set of input/output (I/O) pins and an associated protocol for using them to access the internal test features of the chip 200.

Figure 4:
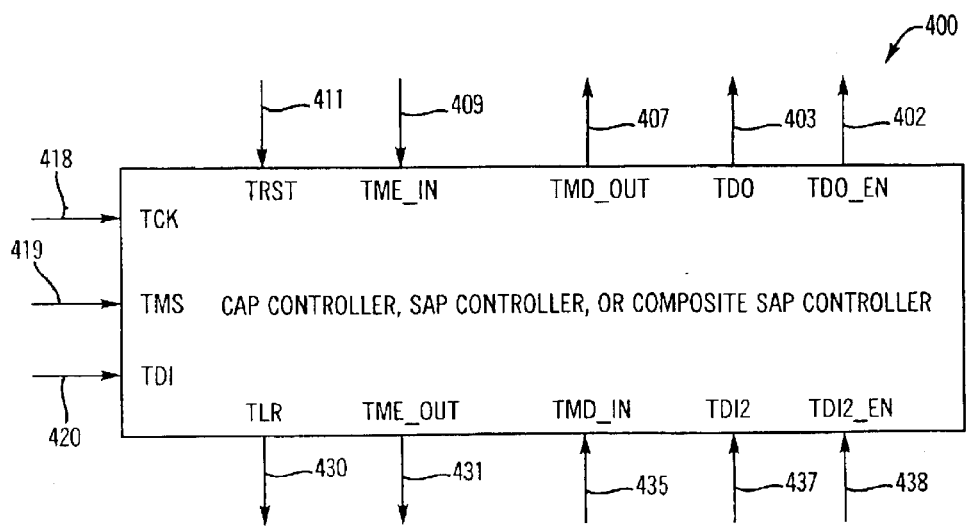
FIG. 4 is a block diagram of a controller for a test circuit block, illustrating input and output signals.

The chip access port 205 is preferably compatible with a standard protocol such as IEEE Standard 1149.1. An advantage of using a standard protocol such as IEEE Standard 1149.1 is that it makes possible use of industry-standard tools to test interconnections among the various chip components. In this example, the chip access port 205 includes several (four or five) dedicated test signal pins, including: a Test Clock (TCK) signal pin, a Test Mode Select (TMS) signal pin, a Test Data Input (TDI) signal pin, a Test Data Output (TDO) signal pin, and, optionally, a Test Reset (TRST) signal pin, the purposes of which are generally analogous to the same signals defined in IEEE Standard 1149.1. FIG. 4 is a block diagram of a preferred test circuit block controller 400, illustrating the input and output signals just described, as may be used in the chip access port 205 or other test circuit blocks as described herein.

The chip access port 205, in one or more embodiments, comprises a chip-level resource that is used to access testability features of the chip 200, including both external (i.e., printed circuit board) and internal (IC component) tests. Within the chip 200, each circuit block is preferably provided with its own test circuit block (which may be referred to as a socket access port (SAP) or design access port (DAP)) through which its testability features can be accessed.

The chip access port 205 preferably comprises an instruction register (IR), a bypass register, a boundary-scan register, and a finite state machine (FSM) which implements the state-transition map as preferably compliant with the IEEE Standard 1149.1. The instruction register of the chip access port 205 is also defined by IEEE Standard 1149.1. A dedicated logic circuit block, referred to as a CAP controller, interfaces the chip access port 205 so that test instructions and data can be exchanged between, e.g., automated test equipment and the chip 200. The CAP controller of the chip access port 205 distinguishes between test actions that involve the instruction register and those that involve any other register (which are referred to as "data registers" to distinguish them from the instruction register). The internal state of the finite state machine indicates whether the instruction register, boundary-scan register, or any other data register actions will be performed, and allows the specified register action (e.g., Capture-xR, Shift-xR or Update-xR, where xR stands for IR or DR, representing an Instruction Register or Data Register action, respectively) to take place. For example, according to the IEEE Standard 1149.1, the instruction register can be updated to receive new values only during the Update_IR state. The Shift_DR state is used to perform serial scan of the currently selected data register. State transitions of the finite state machine may be controlled by an external dedicated test pin of the component.

In a preferred embodiment, the chip access port 205 connects to one or more test circuit blocks referred to as socket access port(s) (SAP(s)), each of which is located on one of the circuit blocks on the chip 200. In the example shown in FIG. 2, the chip access port 205 is coupled to the socket access port 220 of the foundation block 210 and socket access port 221 of peripheral circuit block 212. The chip access port 205 may be coupled to other peripheral circuit blocks as well. Within the foundation block 210, the socket access port 220 may feed into other additional socket access ports. For example, the foundation block socket access port 220 may feed into socket access port 235 of circuit block 230 and socket access port 236 of circuit block 232. Similarly, in a peripheral block (such as peripheral circuit block 212), the socket access port 221 may feed into one or more additional socket access ports.

In one or more embodiments, each socket access port provides an intermediate port and protocol to allow a uniform protocol to be presented to the chip access port 205. The socket access port of any of the foundation block 210 or peripheral block may interface to a design access port (DAP) which is non-standard or otherwise non-compliant with the protocol used by the chip access port 205. The socket access port in such a case allows circuit block test interfaces to communicate with the chip access port 205 and thus provides for test capabilities using a uniform protocol. The interface or mapping between the socket access port and a design access port of a particular circuit block may be made using wires that pass through and/or additional test logic and an associated protocol. In a preferred embodiment, a one-to-one mapping of the socket access port signals on to the design access port and the CAP controller is made. The socket access port architecture is preferably defined so that multiple socket access ports can be linked together (usually during the design stage of the foundation block 210) to form a composite socket access port that is linked to the chip access port 205, thus providing individual design block access through the pins of the chip access port 205.

Each socket access port 220, 221, 235, 236 is preferably compatible with the same standard protocol as is the chip access port 205, such as, e.g., IEEE Standard 1149.1. The test access port finite state machine and its associated test mode select (TMS) input can be excluded from the socket access port 220, 221, 235, 236 by substituting broadside inputs to supply similar state-encoding information available from the finite state machine of the chip access port 205.

Also in chip 200 are a plurality of boundary-scan cells 240 which, as noted with respect to FIG. 1, are placed between the chip access port 205 and the internal circuit blocks to control and/or observe signal values present at the input/output pins connecting the boundary-scan cells to the internal circuit blocks. Generally, one boundary-scan cell 240 will be provided for each input/output pin of an internal circuit block (such as foundation block 210). The boundary-scan cells 240 are, as previously noted, typically connected in series so as to form a scan chain, and may, when so arranged, be collectively referred to as boundary-scan registers or a boundary-scan chain.

To test an embedded circuit block, test vectors may be scanned into the boundary-scan cells (or registers) 240 serially through the chip access port 205 so that test stimuli are applied in parallel to a internal circuit block through its input/output pins. The response of the circuit block under test can be captured in parallel by the boundary-scan cells (or registers) 240. The captured responses may then be scanned out serially through the chip access port 205. The boundary-scan cells (or registers) 240 thereby provide controllability and/or observability for the I/O pins of the internal circuit blocks. The boundary-scan cells (or registers) 240 can also contain additional bits to control the direction of signal flow for bi-directional signals so that multi-drive bus signals on a printed-circuit board can be testable.

Availability of an instruction register in the chip access port 205 makes it possible to program the CAP controller to perform any one of several test actions. Extended test capabilities can be provided through the addition of new instructions. For example, a BIST instruction can be provided that enables (i.e., issues an enable signal to) an existing on-chip BIST controller for testing a circuit block on the chip 200.

Preferably, both the boundary-scan cells (or registers) 240 and the instruction register of the chip access port 205 are loaded and unloaded using serial access (i.e., scan) of their contents, via the Test Data Input (TDI) signal pin and Test Data Output (TDO) signal pin, respectively.

It is possible to connect multiple circuit blocks in series to provide a convenient means of accessing all such components. The bypass register of the chip access port 205 may be embodied as a single-bit register, and can be used to bypass one or more components to reduce the total number of serial shift stages when accessing one of several circuit blocks that have been connected in series.

Activities of the CAP controller may be controlled by the particular instructions loaded into the instruction register (IR), as well as by the internal state of the finite state machine within the chip access port 205. Finite state machine transitions generally take place in response to the value of the test mode select (TMS) signal when the Test Clock (TCK) is applied. Test actions generally occur on the rising or falling edge of the Test Clock (TCK) signal, as specified by the IEEE Standard 1149.1 or other protocol.

The test reset (TRST) signal provides an asynchronous means for forcing the finite state machine into a Test-Logic-Reset state so that functional operation of the target chip 200 can take place unhindered by its test logic.

The instruction register, boundary-scan register and bypass register of the chip access port 205 preferably contain separate serial-shift and parallel-capture stages. Thus, the current state of any of these registers remains unchanged at the parallel-update stage outputs while data is received serially in the serial-shift stage of the register. After the serial-shift operations have been completed, a separate test action (e.g., Update Instruction Registers ("Update_IR") or Update Data Register ("Update_DR")) loads the parallel-update stage from the current values in the serial-shift stage.

The instruction register and data registers preferably sample or capture their input signals on the rising edge of the Test Clock (TCK) signal, whereas the serial and parallel update actions preferably take place on the falling edge of the Test Clock signal. For example, during a serial-shift operation, the Test Data Input (TDI) signal value may be sampled on the rising edge of the Test Clock signal, and a new bit value appears on the Test Data Output signal on the falling edge of the Test Clock signal. In one aspect, the dual-stage register architecture described above, in connection with test action activity in relation to the rising/falling edges of the Test Clock signal, help prevent undesirable effects that may otherwise be caused by rippling of serial-shift stage outputs or skew of the Test Clock signal.

In one or more embodiments, the chip access port 205 and various on-chip socket access ports 220, 221, 235, 236 are arranged in hierarchical test control structure to facilitate testing of on-chip circuit blocks. The chip access port 205 comprises a first tier of the test hierarchy. In the example shown in FIG. 2, socket access ports 220 and 221 comprise a second tier of the test hierarchy, while socket access ports 235 and 236, which are internal to the foundation block 210, form a third tier of the hierarchy, underneath the socket access port 220 that forms part of the foundation block 210. The chip access port 205 and the on-chip socket access ports 220, 221, 235, 236 each preferably include circuitry configured to perform the functionality of a standard JTAG controller operating according to a standard test protocol such as IEEE Standard 1149.1. According to one embodiment, an internal mode register is provided within the lower-tier test circuits—i.e., within each of socket access ports 220, 221, 235 and 236. A higher-tier test control circuit transfers test control to the next level down by setting the mode register in the test control circuit(s) at the next lower level in the hierarchical tree. The higher-tier test control circuit then places itself in a "bypass" mode. When the lower-level test control circuit is finished, it sends a message to the higher-tier test control circuit that originally transferred control over to it, returning control to the higher-level test control circuit. The instructions to pass test operation control upwards and downwards may be conceptually viewed as "pop" and "push" type instructions, respectively.

In some embodiments, the hierarchical tree may comprise more than one test control circuit at a particular level in the tree. Test control circuits at the same level may be linked together, such as in a chain configuration.

Figure 5A:
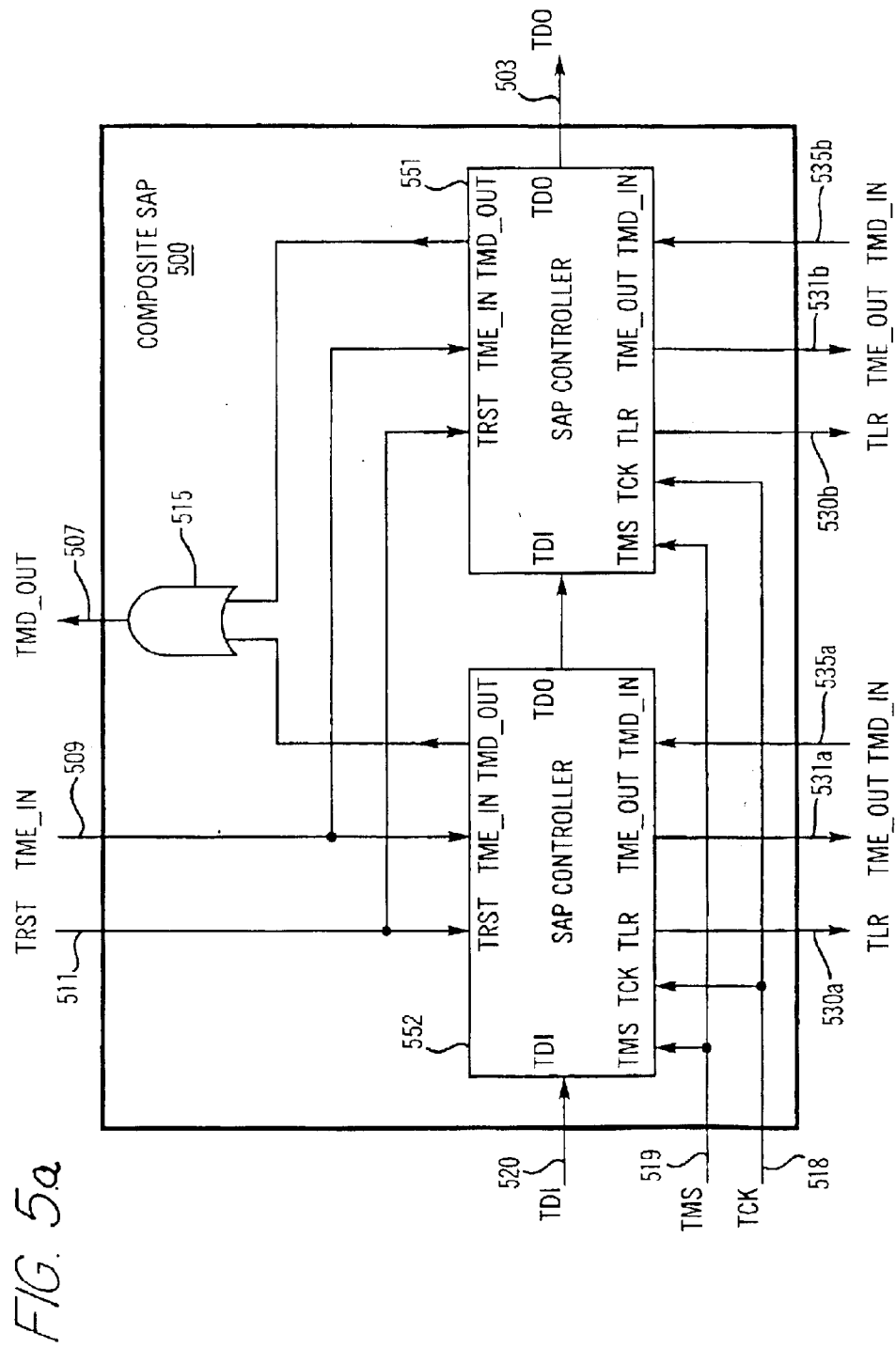
FIG. 5A is a diagram illustrating one example of connecting multiple test circuits together at the same hierarchical level.

Examples of embodiments of test control circuits for performing the foregoing functions are illustrated in FIGS. 4 and 5A. Turning first to FIG. 4, a test control circuit 400, which may be, e.g., a CAP controller, a SAP controller, or a composite SAP controller, is shown having various input and output signals. In particular, the test control circuit 400 includes a Test Clock (TCK) signal 418, a Test Mode Select (TMS) signal 419, a Test Data Input (TDI) signal 420, a Test Data Output (TDO) signal 403, and, optionally, a Test Reset (TRST) signal 411, the functions of which have been previously described. The test control circuit 400 further includes other signals which are either generally known in the IEEE Standard 1149.1 or else will have their functions described in more detail further herein.

Preferably, the socket access ports within the chip 200 share common Test Mode Select (TMS), Test Reset (TRST) and Test Clock (TCK) signals. Within the same level of hierarchy, socket access ports are connected in series, with the Test Data Output (TDO) signal of the previous component connected to drive the Test Data Input (TDI) signal of the next component in series. Between consecutive levels of the hierarchy, the Test Data Output (TDO) signal of the lower-level socket access port is preferably connected to the secondary Test Data Input (TDI2) signal of the test control circuit block (socket access port or chip access port) in the hierarchy.

At the same level of hierarchy (e.g., at the second tier level of socket access ports 220 and 221, or at the third tier level of socket access ports 235 and 236), the test control circuits are preferably connected so as to facilitate a hierarchical test protocol. FIG. 5A is a block diagram illustrating one example of connecting multiple socket access port controllers together at the same hierarchical level. The result may be referred to as a "composite" socket access port (SAP) 500. The composite SAP 500 collectively has the same signal inputs and outputs as a non-composite socket access port (e.g., test control circuit 400).

In more detail, the composite SAP 500 illustrated in FIG. 5A comprises two SAP controllers 551 and 552 preferably connected in the manner shown. As illustrated, since SAP controllers 551 and 552 are at the same level of hierarchy, the Test Data Output (TDO) signal of the first SAP controller 552 is connected to drive the Test Data Input (TDI) signal of the second SAP controller 551 in series. Both SAP controllers 551 and 552 share common Test Mode Select (TMS), Test Reset (TRST) and Test Clock (TCK) signals, as well as a common Test Mode Enable Input (TME_IN) signal. The Test Mode Disable Output (TMD_OUT) signals from both SAP controllers 551 and 552 are logically OR'd through logic gate 515, resulting in a consolidated TMD_OUT signal 507. Each SAP controller 551 and 552 has its own Test Logic Reset (TLR) signal (530 and 530b, respectively), its own Test Mode Enable Output (TME_OUT) signal (531a and 531b), and Test Mode Disable Input (TMD_IN) signal (535a and 535b, respectively), allowing them to control testing with respect to their individual circuit blocks. For example, SAP controller 552 may correspond to socket access port 220 at the second level of hierarchy in FIG. 2, and SAP controller 551 may correspond to socket access port 221. Likewise, SAP controller 552 may correspond to socket access port 235 at the third level of hierarchy in FIG. 2, and SAP controller 551 may correspond to socket access port 236.

Additional SAP controllers may be connected in series by connecting the TDO signal of one SAP controller to the TDI signal of the next SAP controller in the chain. The principles of FIG. 2 may thus be extrapolated to any number of SAP controllers in series.

In operation, the SAP controllers 551 and 552 (and any additional SAP controllers, if applicable) act in tandem so that each of the instruction registers (IRs) internal to the SAP controllers 551 and 552 is loaded with a new instruction simultaneously. It is possible to provide different op-code values to different integrated circuits along the serial chain.

Figure 5B:
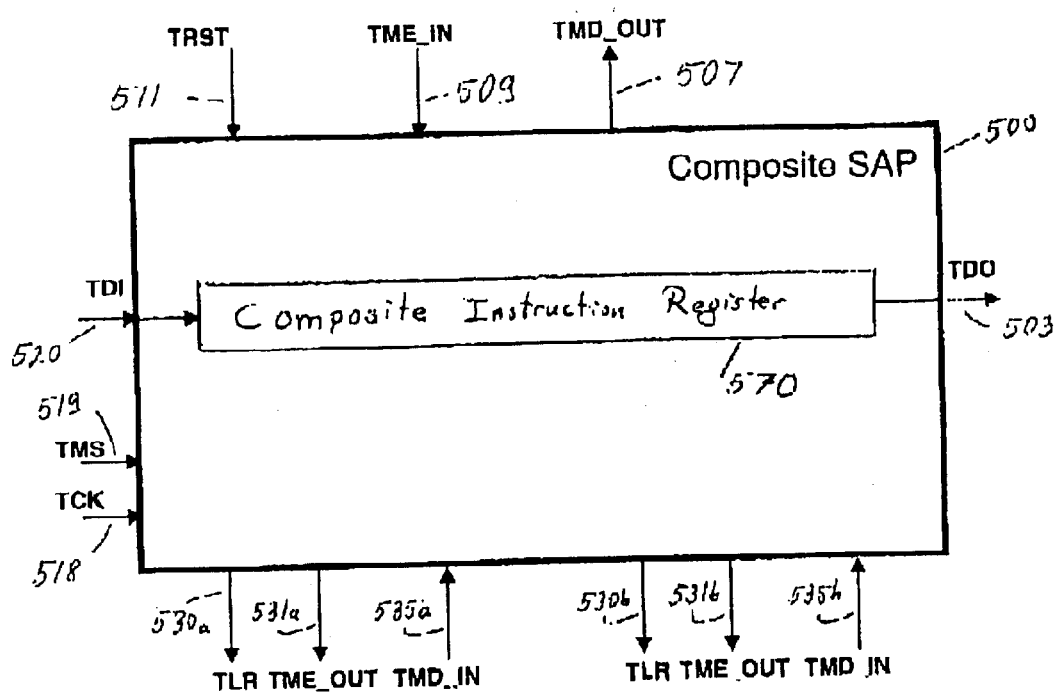
FIG. 5B is a diagram illustrating another example of connecting multiple test circuits together at the same hierarchical level, using a composite instruction register for the test circuits at the same level.

FIG. 5B is a diagram illustrating another example of connecting multiple test circuits together at the same hierarchical level, using a composite instruction register for the test circuits at the same level.

In certain embodiments, multiple integrated circuits may be programmed to cooperate with each other to carry out particular tests. For example, multiple integrated circuits may be loaded with an external test (EXTEST) instruction so that output values that are driven by some of the integrated circuits can be captured at the input pins of the same or other integrated circuits to test printed circuit board inter-connections among integrated circuit pins.

Figure 7:
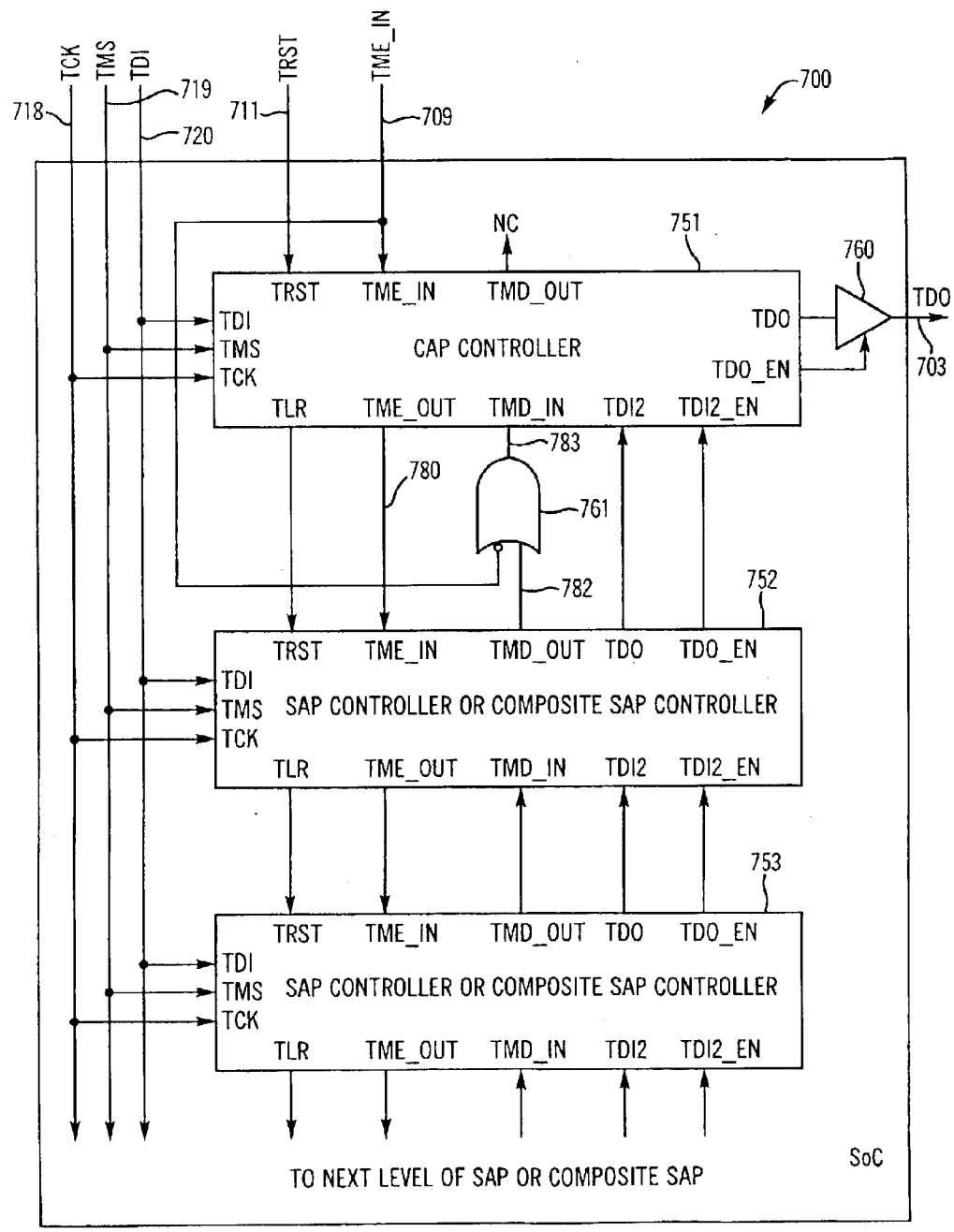
FIG. 7 is a diagram illustrating one example of connecting multiple test circuits together at different hierarchical levels.

FIG. 7 is a diagram illustrating one example of connecting multiple test circuits together at different hierarchical levels. As shown in FIG. 7, a chip access port (CAP) controller 751 is at the highest level (i.e., first tier) of the hierarchy. A second-tier test circuit block 752 (such as a SAP controller or a composite SAP controller, as illustrated in, e.g., FIG. 5A) is connected beneath the CAP controller 751. A third-tier test circuit block 753 (such as a SAP controller or a composite SAP controller, as illustrated in, e.g., FIG. 5A) is connected beneath the second-tier test circuit block 752. Further test circuit blocks may be connected beneath the second tier in a similar manner.

The CAP controller 751 and each of the lower-tier test circuit blocks (e.g., test circuit blocks 752 and 753) preferably share a common Test Clock (TCK) signal 718, Test Mode Select (TMS) signal 719, and Test Data Input (TDI) signal 720. A Test Reset signal 711 feeds into the TRST input of the CAP controller 751. A TME_IN signal 709 feeds into the TME_IN input of the CAP controller 751, and may also be gated with TMD_OUT signal from the second-tier test circuit block 752, so it can be used to drive the TMD_IN port of the CAP controller 751. In an alternative embodiment, gate 761 may be included inside the CAP controller 751. The Test Data Output signal 703 is developed from the CAP controller 751. At each lower-level test circuit block, the Test Data Output (TDO) signal feeds into the secondary Test Data Input (TDI2) signal of the higher-level test circuit block. Likewise, if the TDO output from the test circuit block is accompanied with a discrete TDO-EN output signal from the same block, the secondary Test Data Output Enable (TDO_EN) signal of the lower-level test circuit block feeds into the secondary Test Data Input Enable (TDI2_EN) signal of the higher-level test circuit block. Otherwise, the TDI2-EN input may be permanently wired to a constant logic value to signify that TDI2-EN is always enabled. The Test Logic Reset (TLR) signal of each higher-level test circuit block feeds into the Test Reset (TRST) output from the lower-level test circuit block, so that when the top-level CAP controller 751 is reset (e.g., CAAP controller 751 is in Test_Logic_Reset state), all other test circuit blocks 752, 753, etc. are also reset. The Test Mode Enable Output (TME_OUT) signal of each higher-level test circuit block feeds into the Test Mode Enable Input (TME_IN) signal of the lower-level test circuit block to facilitate passing test control downwards within the hierarchical network of test controllers.

Figure 8A:
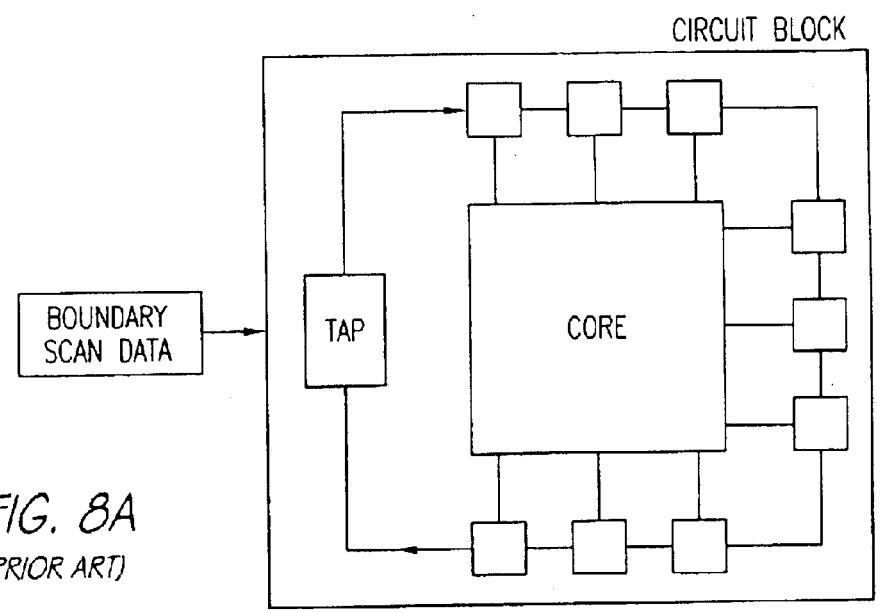
FIGS. 8A and 8B are diagrams illustrating the conversion or adaption of boundary scans for use in a hierarchical test structure.
Figure 8B:
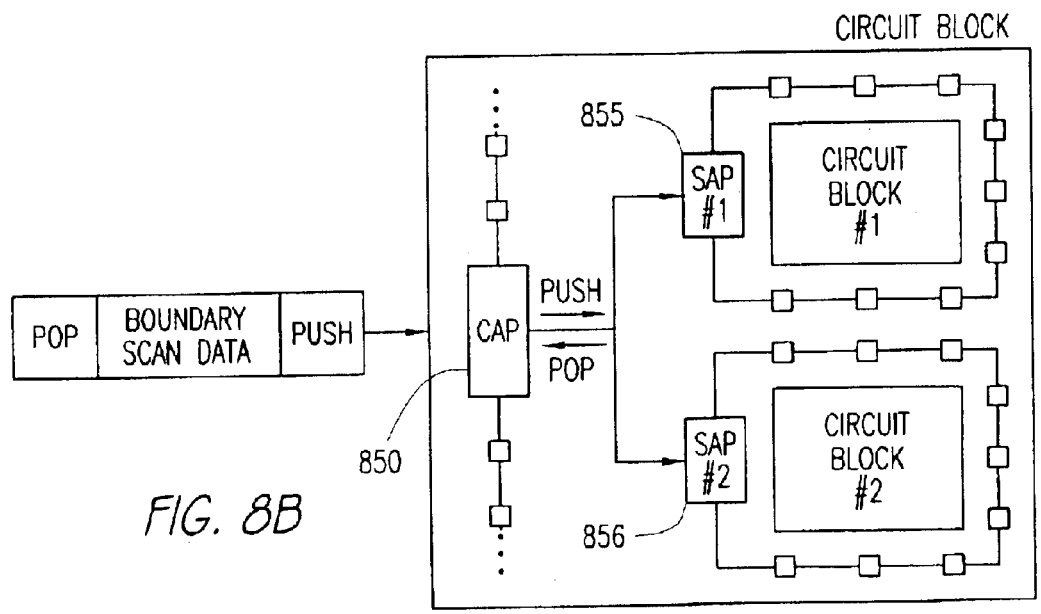

Access to the lower-level or lower-tier test circuit blocks can be achieved by adding "push" or "pop" type instructions to existing boundary scan streams. FIGS. 8A and 8B illustrate this operation. FIG. 8A conceptually shows a serial boundary scan stream as may be applied to a circuit block in order to test the block through a test access port. FIG. 8B illustrates conversion of the serial boundary scan stream for use in a hierarchical test structure. As shown in FIG. 8B, a "push" type instruction is added to the start of the serial boundary scan stream, and a "pop" type instruction is added to the end of the serial boundary scan stream. The "push"

instruction instructs the higher-level test circuit block 850 (e.g., the chip access port) to temporarily place itself in a pass-through mode, causing the boundary scan control and data values to pass through the higher-level test circuit block 850 and be received by the lower-level test circuit block (in this example, test circuit blocks 855 and 856, which may be configured as a composite SAP). The lower-level test circuit blocks 855, 856 then respond to the boundary scan controls, and the results are passed through the higher-level circuit block 850 back to the requesting source (e.g., external tester). The "pop" instruction instructs the higher-level test circuit block 850 to remove itself from the pass-through mode, and to lower-level test circuit blocks 855, 856 to thereafter become non-responsive to any boundary scan test.

Additional "push" and "pop" instructions can be added to access lower levels in the hierarchy. In this fashion, each "push" type instruction instructs the receiving (i.e., presently active) test circuit block to temporarily place itself in a pass-through mode and thereby pass control down to the next level in the hierarchy, and each "pop" type instruction instructs the receiving test circuit block at the lower level to instruct the next higher-level test circuit block to return control back to the previous-level test control block and de-activate itself.

A "push" instruction preferably pushes the boundary scan stream to all test circuit blocks (e.g., all socket access ports) at the next lower level in the hierarchy. However, a "pop" instruction received from any one of the lower level test circuit blocks causes the higher-level circuit block to exit the active (e.g., boundary-scan) mode and resume its inactive state.

In one or more embodiments, hierarchical access to test controllers can be implemented to make it possible for a lower-level SAP controller to become directly controllable using the component-level pins (i.e., the pins of the chip access port 205). Using the same set of chip access port pins to recursively communicate with both the CAP controller of the chip access port 205 or with the next-level SAP controller is more easily achieved when both the CAP controller and the SAP controllers operate in a uniform fashion. Accordingly, the following rules are provided for achieving a hierarchical test structure.

First, a socket access port (SAP) controller that supports hierarchy preferably includes a mode of operation that is compliant with the standard test protocol of interest—for example, the IEEE Standard 1149.1.

Second, the CAP controller and lower-level SAP controllers are preferably implemented so that the TMS, TDI, and TCK input signals are treated as global signals that are used in common. This implementation feature is preferred because use of the chip access port 205 to communicate with either the CAP controller or the lower-level SAP controllers may require a mechanism for enabling one test circuit controller while disabling other test circuit controllers.

While the IEEE Standard 1149.1 itself does not directly support such a behavior, provision has been made in the Standard to deviate from the mandated behavior by using one or more Compliance-Enable input pins. Using a Compliance-Enable signal makes it possible to alert external hardware and software test resources that a different, non-compliant behavior can be expected. This prevents errant behavior/response from external test resources whose normal behavior/response becomes enabled on re-entering the compliant mode.

As another general design rule, a dedicated input pin of the chip access port 205 is preferably provided as a test mode enable (TME_IN) signal. This signal serves the function of differentiating between the hierarchical mode of operation as described herein, versus IEEE Standard 1149.1 compliant (i.e., non-hierarchical) mode of operation by the CAP controller of the chip access port 205.

In particular, the TME_IN signal may be used to indicate that the CAP controller of the chip access port 205 has entered a non-IEEE compliant mode. TME_IN provides control that flows from a CAP controller or SAP controller at a higher level of hierarchy to the SAP controller that is directly underneath it. The higher-level hierarchical SAP controller preferably becomes unresponsive to the TMS and/or TCK input signals until control is returned to it by the lower-level SAP controller. Therefore, a reverse-direction control flow is provided so that, in effect, a robust handshaking protocol is implemented between two consecutive hierarchical controllers according to the various signals and connections described herein.

As another design rule, a test mode disable output (TMD_OUT) signal is preferably provided to control flow in the reverse direction when returning control from a lower-level SAP controller to the higher-level SAP controller or, if at the top level, to the CAP controller of the chip access port 205.

The following table summarizes the preferred signals, and other general information pertaining thereto:

TABLE 1

| Signal | Signal Name | Direction | Type |
|---|---|---|---|
| Test Data Input | TDI | input | shared |
| Test Mode Select | TMS | input | shared |
| Test Clock | TCK | input | shared |
| Serial Output | TDO | output | |
| Test Reset | TRST or TRSTN | input | asynchronous |
| Test Mode Enable Input | TME_IN | input | |
| Test Mode Disable Output | TMD_OUT | output | |
| Test Mode Enable Output | TME_OUT | output | |
| Test Mode Disable Input | TMD_IN | input | |
| Input Data | TDI2 | input | |
| Test Logic Reset | TLR | output | asynchronous |

Although all of the hierarchical SAP controllers on the chip 200 preferably share the TDI, TMS and TCK signals with the CAP controller of the chip access port 205, each SAP controller also preferably drives its own TME_OUT and TMD_OUT, which are received by the lower-level and upper-level SAP controller respectively. In a preferred embodiment, the TME_OUT and TMD_OUT signals from the present-level SAP controller drive the TME_IN port of the SAP controller at the next-level of the hierarchy and the TMD_IIN port of the SAP controller at the previous-level of the hierarchy, respectively. Additionally, in certain embodiments, each SAP controller may receive a scan output (SO) signal from the lower-level SAP controller and pass the signal value to the upper-level SAP controller or CAP controller so that the SO output from the enabled SAP controller becomes observable at the chip's TDO output pin.

Figure 10:
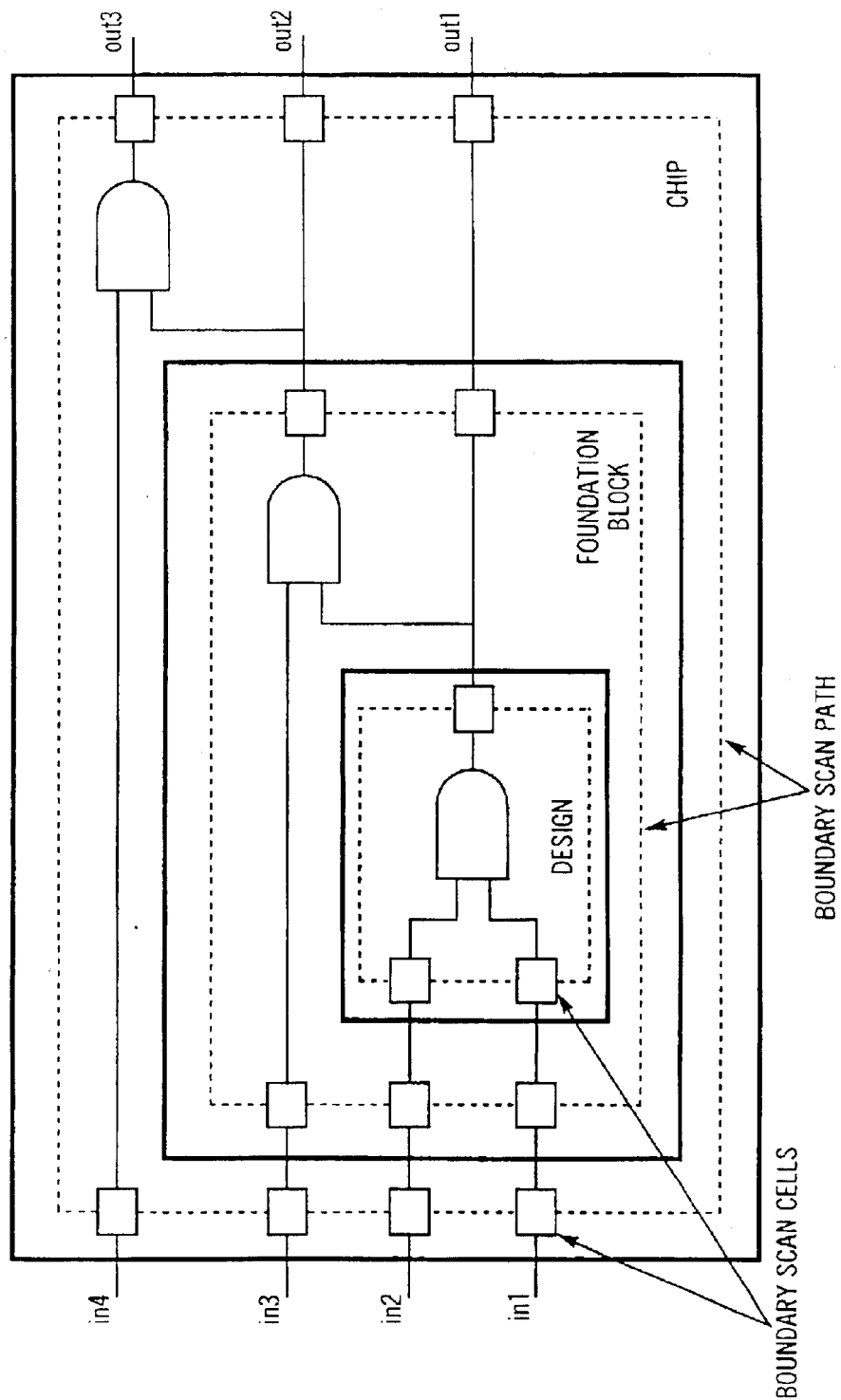
FIG. 10 is a diagram illustrating connection of layered or hierarchical circuit blocks within an integrated circuit design.

FIG. 10 is a diagram illustrating connection of layered or hierarchical circuit blocks within an integrated circuit design.

Figure 13:
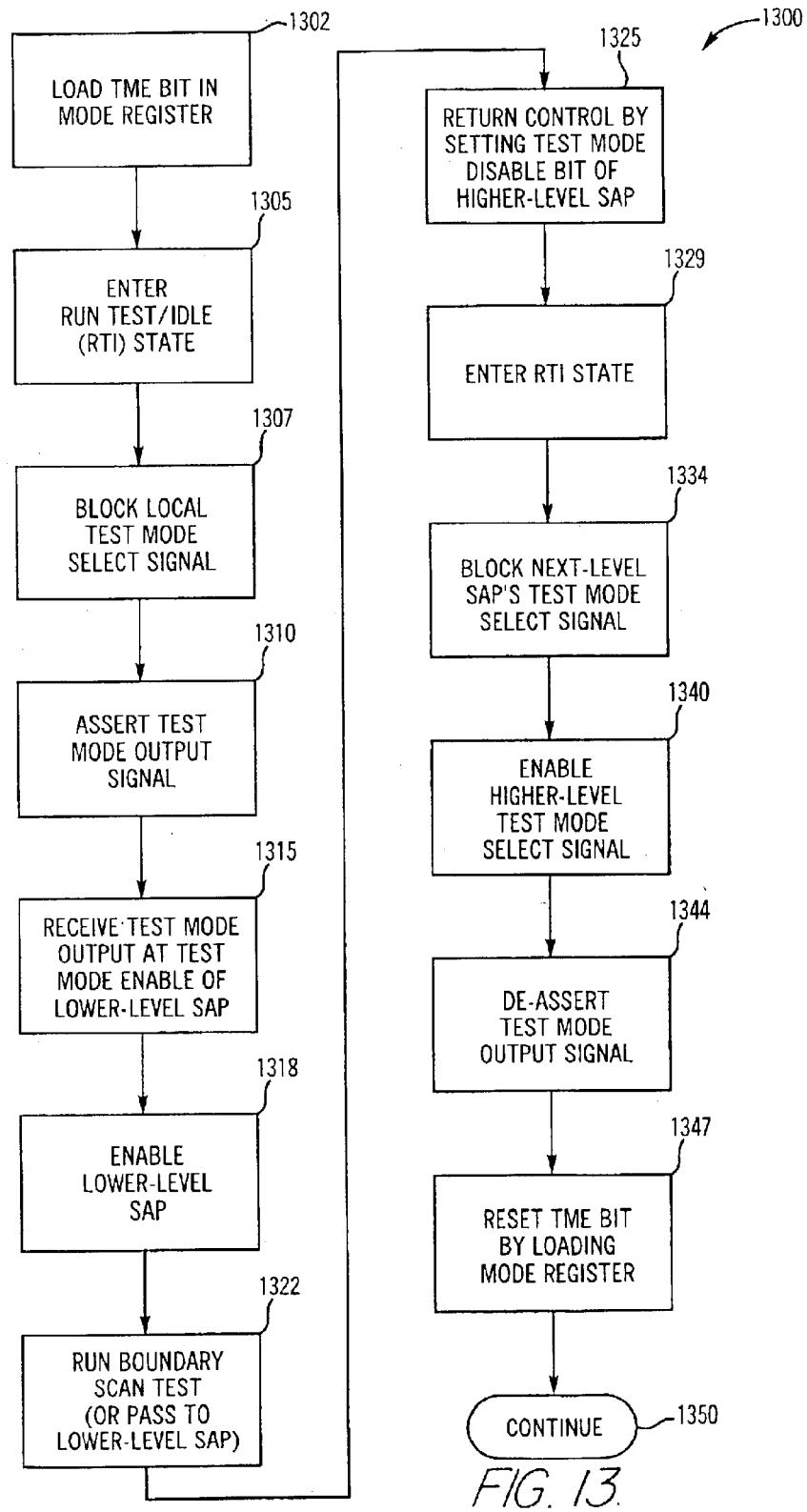
FIG. 13 is a process flow diagram illustrating a preferred technique for hierarchical test control.

A process flow diagram showing a process for passing boundary scan controls from one level of the hierarchy to the next level, and then returning control back to the previous level, according to a preferred technique for hierarchical test control is illustrated in FIG. 13. The various steps in FIG. 13 may be explained for convenience with respect to the hierarchical test control structure shown in FIG. 7, although its principles are applicable to other hierarchical test control structures as well. The example will be explained with respect to transfer of test control from the top-level test circuit block (i.e., chip access port (CAP) controller 751) to the next-level test circuit block (i.e., socket access port controller or composite SAP controller 752), although it could also apply to transfer of test control from test circuit block 752 to test circuit block 753. As shown now in FIG. 13, in a first step 1302 of the process 1300, a test mode enable (TME) bit is loaded into the mode register of the CAP controller 751. Next, as indicated by step 1305, the CAP controller 751 is placed in a run-test/idle (RTI) state using the Test Mode Select (TMS) input that controls its Finite State Machine (FSM). As a result, the Test Mode Select input to the CAP controller 751 becomes blocked (step 1307), and the test mode enable output (TME_OUT) signal 780 is asserted (step 1310). Thus, the CAP controller 751 enters a pass-through state, in which it stops responding to the TMS input and transfers test data received in its secondary test data input (TDI2) port to its test data output (TDO) port.

The test mode enable input (TME_IN) signal of the next-level test control block 752 receives the asserted TME_OUT signal 780 from the CAP controller 751, as indicated by step 1315, and, in response, the CAP controller 751 becomes enabled in a test mode. The test control block 752 then runs the particular test routine—e.g., a boundary scan—or else passes test control down to the next level in the hierarchy, if the test program is so configured, as indicated by step 1322. Output test data is transmitted from the test data output (TDO) signal of circuit block 752 to the secondary test data input (TDI2) signal of the CAP controller 751, which passes it along via its own test data output (TDO) signal. When the test is complete, the test circuit block 752 returns control to the CAP controller 751 by setting the TMD bit in the mode register of the test controller 752. Then, the Finite State Machine (FSM) in test controller 752 is placed in the run-test/idle (RTI) state, whereupon its test mode disable output (TMD_OUT) signal 782 becomes asserted. The TMD_OUT signal 782 is then received as the test mode disable input (TMD_IN) signal 783 at the CAP controller 751. The test circuit block 752 then enters a run-test/idle (RTI) state (step 1329) and its test mode select (TMS) signal becomes blocked (step 1334). In this manner, the test controller 752 returns to its inactive state so that the CAP controller 751 can receive control again.

Next in the process 1300, after the CAP controller 751 receives the test mode disable input (TMD_IN) signal 783, it re-enables its test mode select (TMS) signal, and terminates its pass-through functioning. The CAP controller 751 de-asserts its test mode enable output (TME_OUT) signal, as indicated by step 1344, and then, in step 1347, resets its test mode enable (TME) bit by loading the mode register. This completes the transfer of control from test controller 752 back to the CAP controller 751. The CAP controller 751 then continues with any test actions or terminates the test, according to the test instructions.

Preferably, the test mode enable output (TME_OUT) signal and test mode disable output (TMD_OUT) signal are not generated, even if the appropriate bit of the mode register is set, until the internal finite state machine of the CAP controller 751 or test circuit block 752 enters a run-test/idle (RTI) state. This operation allows setting of the test mode enable (TME) bit followed by loading of another instruction (e.g., EXTEST) in the instruction register, which may be used to isolate the current test circuit block, before passing control to the next-level test circuit block. To achieve this functionality, the test circuit block preferably is not allowed to pass through the run-test/idle (RTI) state while loading an EXTEST or other similar instruction, until the proper time for relinquishing control to the next-level test circuit block.

An advantage of a hierarchical test control scheme is that it allows convenient re-use of boundary scan patterns that have been generated for individual virtual components. A chip design may comprise a plurality of individual virtual components (and hence may itself be viewed as a "composite" virtual component). The same virtual components may be re-used in numerous chip designs. Each virtual component may, during its design, be provided with a test vector or boundary scan data for verifying its functionality. When placed in a chip design, the virtual components still may need to be tested. It could be quite burdensome, without the disclosed hierarchical structure, to re-compute all of the test data in the test vectors or boundary scans for each virtual component in a chip design or other composite virtual component. According to a feature as provided by embodiments of the disclosed hierarchical test control structure, by adding a single "push" sequence (e.g., instruction) to the start of a pre-existing test vector and a single "pop" sequence (e.g., instruction) to the end of the pre-existing test vector, the pre-existing test vector may be conveniently utilized in the testing of the composite virtual component.

Moreover, various embodiments as described herein may be used in a manner compliant with widely accepted IEEE 1149.1 standard specifications.

Figure 6:
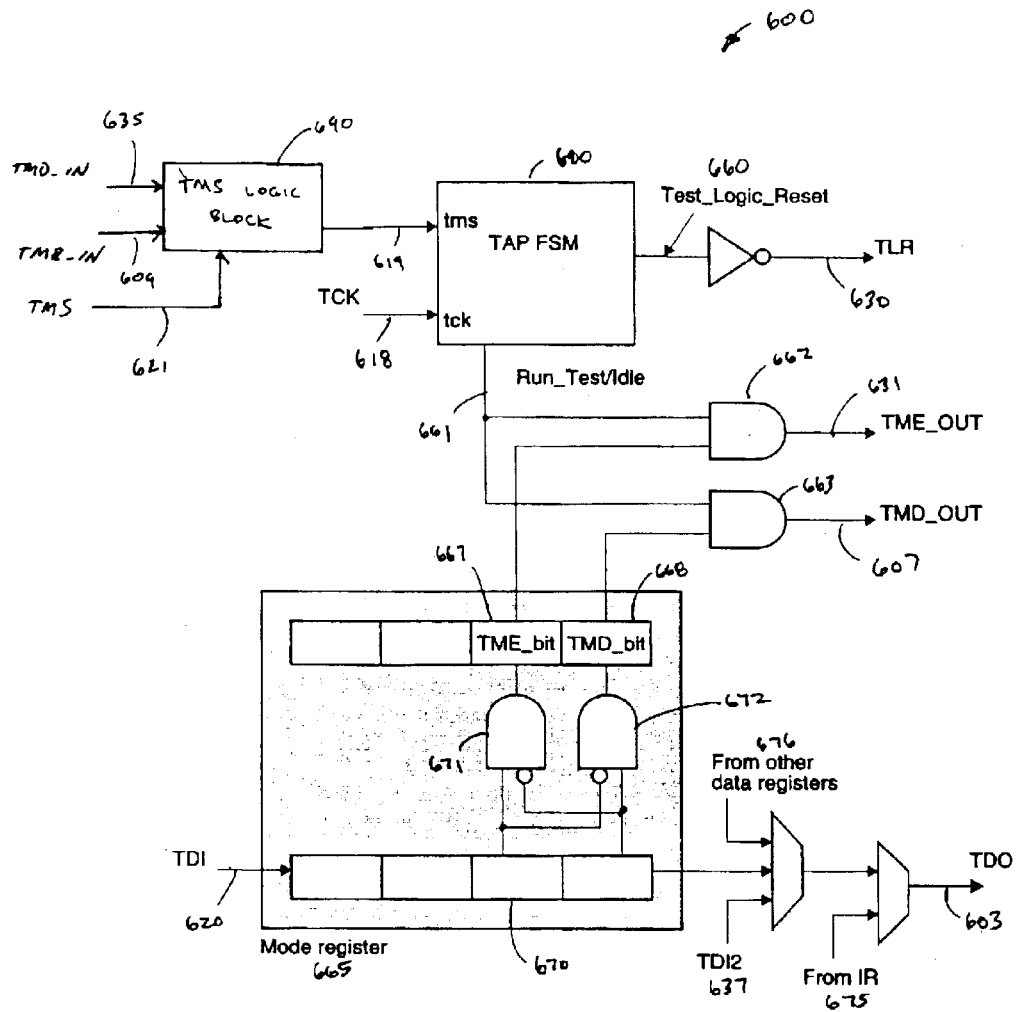
FIG. 6 is a circuit diagram showing an example of a test circuit architecture for implementing some of the test control and data signals disclosed herein.

FIG. 6 is a more detailed circuit diagram showing an example of a test circuit architecture, such as may be used for, e.g., a socket access port in the chip 200 shown in FIG. 2. As shown in FIG. 6, a test circuit block 600 comprises a test access port (TAP) finite state machine (FSM) 680 which receives a local Test Mode Select (tms) signal 619 and a Test Clock (TCK) signal 618. In order to implement behavior depicted in process flow 1300, the local Test Mode Select (tms) signal 619 is derived from a global Test Mode Select (TMS) signal 621, which is passed through a TMS logic block 690 (along with TMD_IN signal 635 and TME_IN signal 609), where it is either blocked or allowed to be received at the "tms" input of the finite state machine 680. The finite state machine 680 outputs a Test Logic Reset (TLR) signal 630 and also a Run_Test/Idle signal 661, the latter of which is used as a gating signal to control other output signals (specifically, TME_OUT and TMD_OUT) via logic gates 662 and 663. A mode register 665 includes a serial-input register 670 that receives serial input data from the Test Data Input (TDI) signal 620. The Test Data Output (TDO) signal 603 is developed from the contents of the register 670, the TDI2 signal 637, the instruction register 675, as well as data from other registers.

It another embodiment, the functionality of the TME_bit and TMD_bit in the mode register can be implemented within the Instruction Register of the SAP (or CAP) controller—for example, by employing a PUSH instruction or a POP instruction, respectively.

Figure 14:
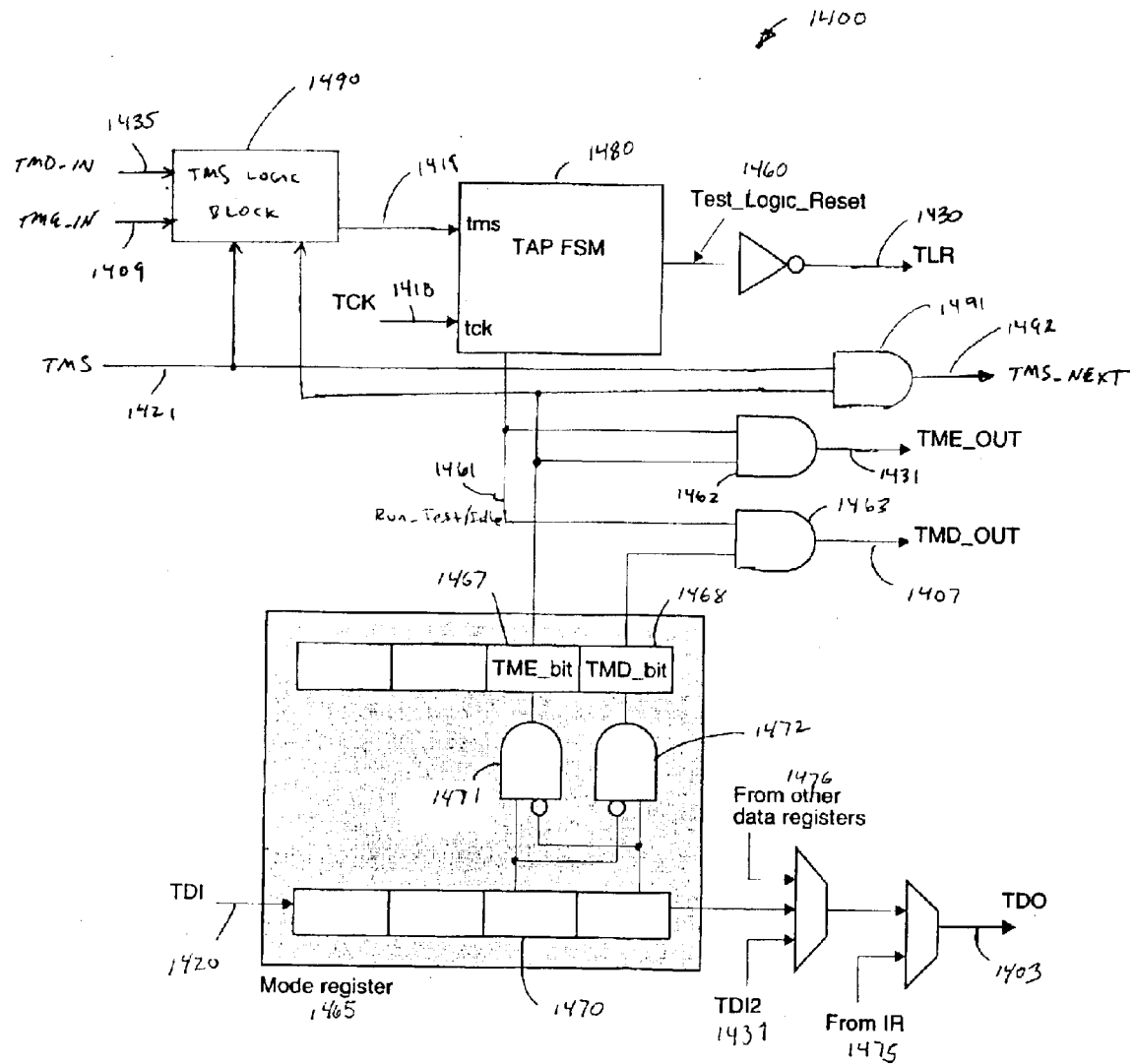
FIG. 14 is a circuit diagram showing an alternative test circuit architecture in which a test mode select signal is propagated from level to level under the control of the test mode enable bit in the test circuit's instruction register.

It is also possible to implement the hierarchical test control circuit so that a portion of the TMS logic (i.e., the circuitry designated as TMS logic block 690 in FIG. 6) is implemented within the circuitry of the previous-level test controller. FIG. 14 illustrates an embodiment of such a test circuit architecture. The test circuit shown in FIG. 14 is similar to that of FIG. 6, but with a few differences; accordingly, items numbered with reference numerals "14xx" in FIG. 14 generally correspond to items numbered with reference numerals "6xx" in FIG. 6. In FIG. 14, the TME_OUT output port is supplemented by a TMS_NEXT output port 1599 such that the logic value of TMS_NEXT is defined by the relationship: TMS_NEXT=TMS & TME_OUT, where "&" represents a logical AND function. In the FIG. 14 embodiment, test controllers at each level of the hierarchy receive their TMS signal from the TSM_NEXT output of the test controller at the previous level of the hierarchy instead of (as in the FIG. 6 embodiment) all test controllers receiving a common TMS signal. An advantage of the embodiment in FIG. 14 is that the TME_IN input port can be eliminated, potentially leading to a simpler circuit implementation.

Figure 15:
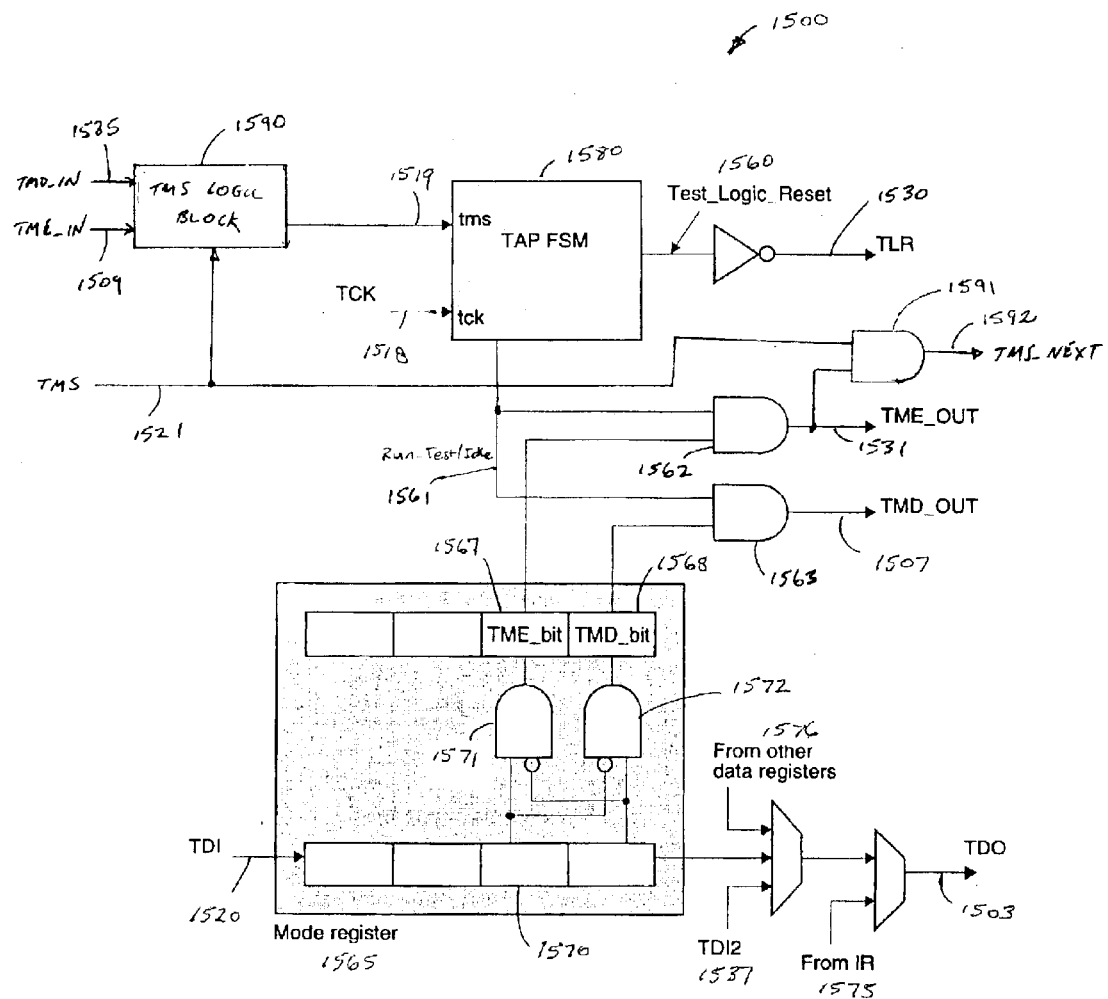
FIG. 15 is a diagram illustrating another test circuit architecture similar to FIG. 14, but using a test mode enable output as a gating signal to selectively pass the test mode select signal to the next level in the hierarchy.

In yet another embodiment, shown in FIG. 15, a test circuit architecture is illustrated for accomplishing a similar functionality to the test circuit of FIG. 14. However, rather than gating the TMS signal directly with the TME_bit 1567, in the test circuit 1500 of FIG. 15 the TME_OUT signal 1531 is used to gate the TMS signal 1521 in order to generate a TMS_NEXT signal 1592.

Figure 12:
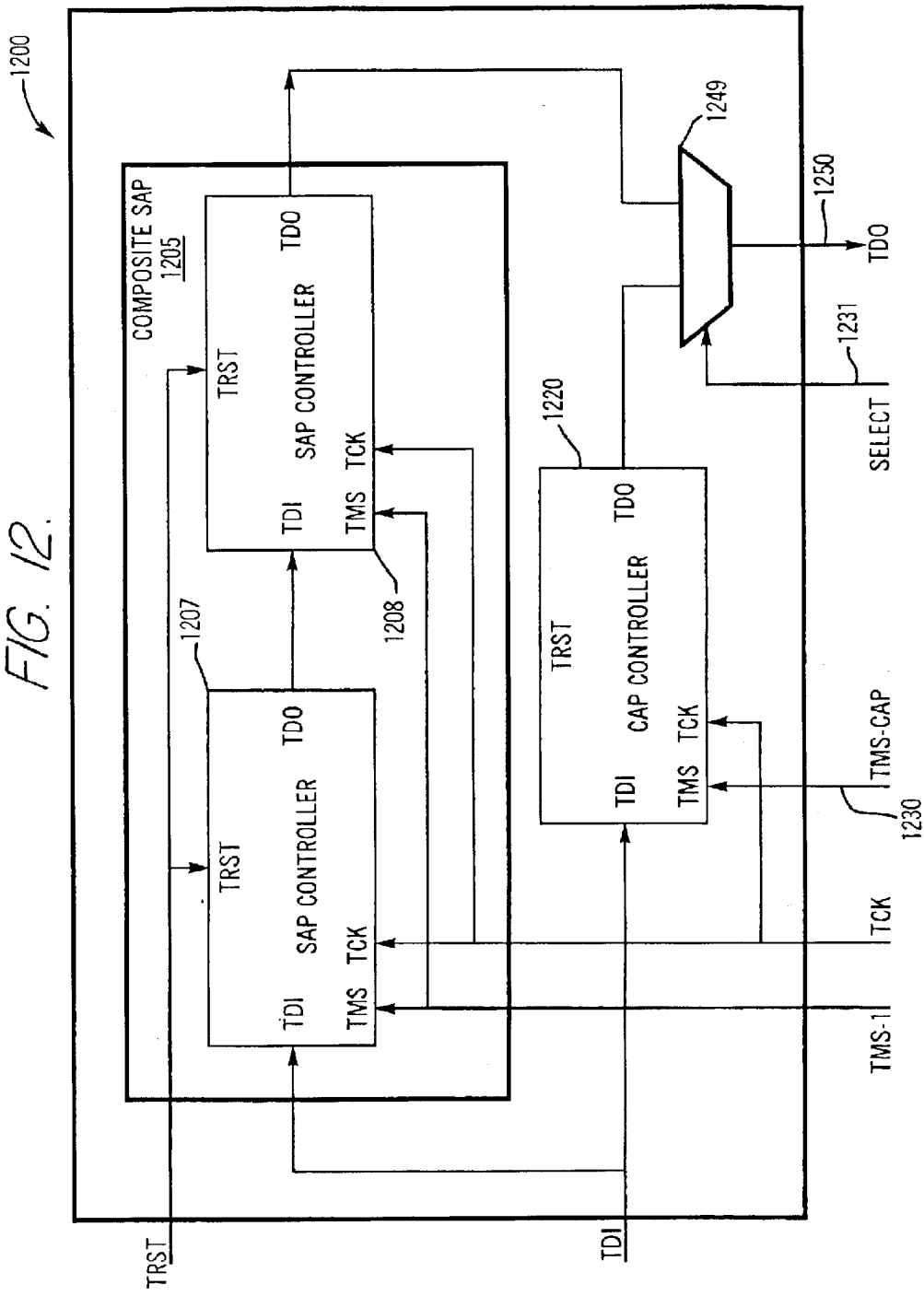
FIG. 12 is a circuit block diagram of an embodiment of a non-hierarchical design assess port (DAP).

FIG. 12 illustrates an embodiment of a non-hierarchical design access port (DAP) and additional signals (e.g., SELECT 1231) and components (e.g., multiplexor 1249), as may be used in various test circuit architectures as disclosed herein. When hierarchical access is not needed for communicating with other test controllers in the circuit design, a conventional (e.g., IEEE Standard 1149.1) test access port (TAP) controller can be used to implement a DAP controller, according, for example, to the configuration shown in FIG. 12. In FIG. 12, a composite SAP 1205 comprising two SAP controllers 1207, 1208 is shown connected to a CAP controller 1220. Two additional test input signals 1230, 1231 are provided through the chip access port 205 of the chip 200. Test input signal 1230 (TMS-CAP) provides the CAP controller 1220 with a TMS signal separate from the TMS signal of the design access port so that the instruction register of the CAP controller 1220 can be operated independently of the design access port. The other test input signal 1231 (SELECT) selects (via multiplexer 1249) a serial output value from either the CAP controller 1220 or the composite SAP 1205 to be observed at the Test Data Output (TDO) signal 1250.

Figure 9:
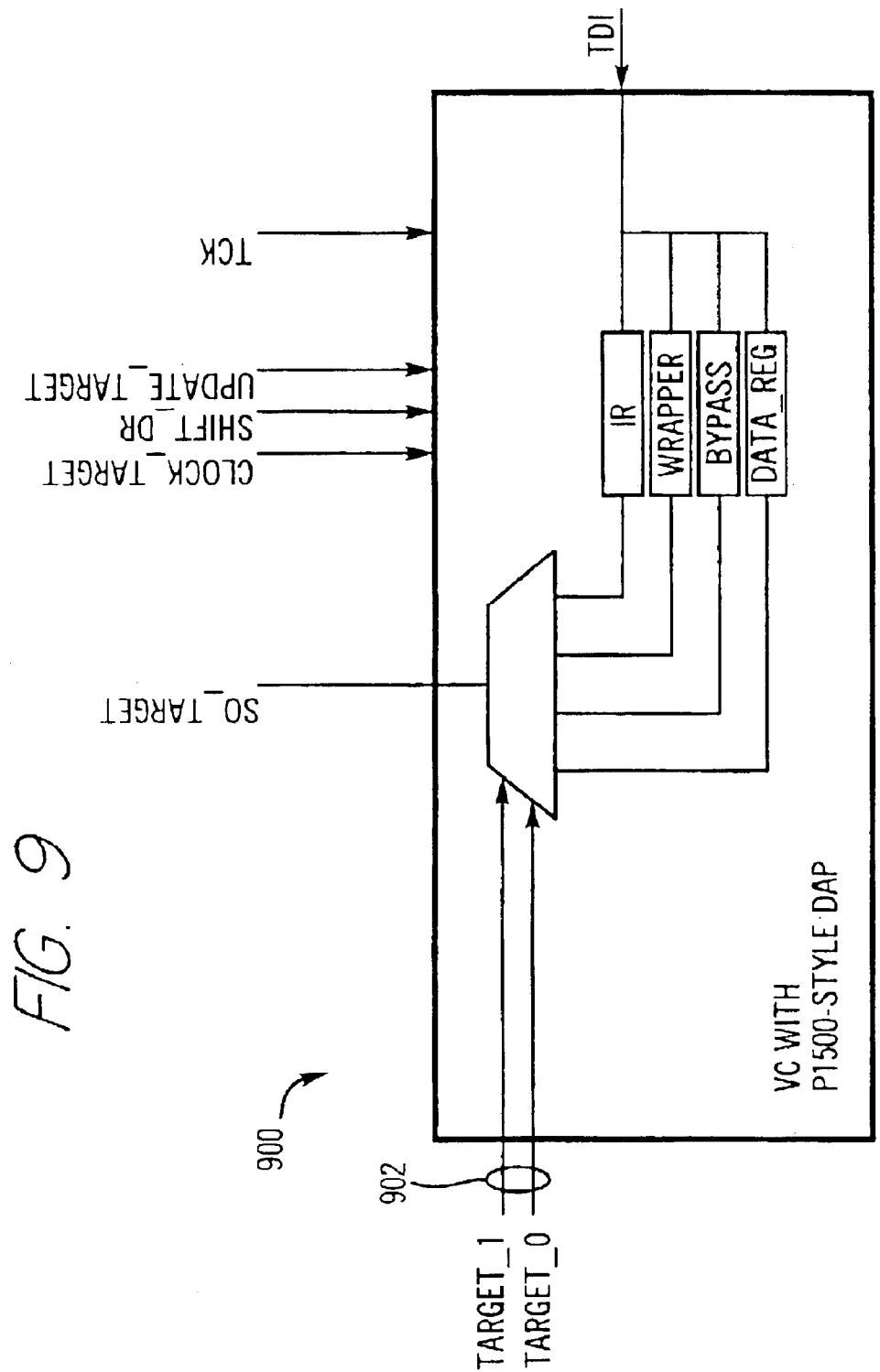
FIG. 9 is a diagram illustrating a design access port (DAP) architecture compliant with the P1500 standard.

A second approach for implementing the DAP controller is to use a simplified test access port (TAP) controller that does not contain the TAP finite state machine. In such an embodiment, the DAP controller still contains the instruction register (IR) and BYPASS-REGISTER and uses multiple mode select signals (e.g., Select-IR or Select-DR) that select either the IR or some other data register and enable the Capture, Shift, or Update mode of operation for that register. The mode select signals are received as control inputs to the DAP controller. An additional test input pin is used to select the serial output value from either the CAP controller or the DAP controller to become observable at the test circuit's TDO pin. To simplify the task of interfacing a test controller to the chip access port 205 or another test controller that contains the TAP finite state machine, the test access controller should be configured so that its broadside control signals, such as mode select, are mapped onto the critical states of the TAP finite state machine. For this reason, the DAP controller is preferably provided with the following mode select signals:

Test-Logic-Reset: Asynchronously resets the DAP controller
Run-Test-idle: Allows execution of the currently selected test instruction
Capture-DR: Captures new values into the selected date register
Shift-DR: Allows serial shifting of values inside the selected data register
Update-DR: Causes updating of new values into the selected data register from its corresponding serial-shift stage
Shift-IR: Allows serial shifting of values inside the instruction register
Update-IR: Updates the newly shifted values into the parallel-update stage of the instruction register, making a new test instruction active in the DAP controller Adherence to the rising-edge/falling-edge utilization of TCK is convenient to simplify driving the mode select inputs to the design access port (DAP) from the CAP controller. A "simplified" DAP controller 900 is illustrated in FIG. 9. The DAP controller 900 may follow the guidelines of the Working Group for the IEEE P1500 Standard for Embedded Core Test (SECT), hereby incorporated by reference as if set forth fully herein. Details of the IEEE P1599 Standard are described in, e.g., E. Marinissen et al, *Towards a Standard for Embedded Core Test: An Example*, IEEE Conf. Proceedings, 24.1., pp. 616–627, ITC'99, hereby incorporated by reference as if set forth fully herein. The IEEE P1500 Standard permits use of a mode register with a set of bits that controls whether or not the DAP controller is active. A first bit allows the DAP controller 900 to be effectively "turned off," thus allowing it to become pass-through. Another bit causes the DAP controller to re-start, and leave the pass-through mode.

The following basic characteristics of a non-hierarchical DAP controller are preferred:
The DAP should contain dedicated test signals:
  Serial input (SI)
  Serial output (SO)
  Test clock (TCK)
  One or more broadside, level-sensitive test control signals. As a guideline, these signals should indicate modes of operation that mirror the internal states of the TAP finite state machine.
The DAP controller should provide a serially-programmed instruction register (IR) with a serial-shift stage and a separate, parallel-update stage that is loaded from the serial-shift stage.
The DAP controller should provide a single-bit BYPASS_REGISTER.
The DAP controller may contain any number of data registers that might be necessary to support the test features of the circuit block that it controls.
The DAP controller can optionally contain the IEEE 1149.1 TAP finite state machine and its associated TMS input to control actions of the instruction register and other data registers. If the TAP finite state machine is provided, the TMS input to the DAP should be a dedicated input pin to the chip. Reset logic should be provided so that the DAP controller is reset whenever the CAP controller is reset.
If the DAP controller does not contain the IEEE 1149.1 TAP finite state machine, then the following characteristics are preferred:
  The DAP controller should contain one or more broadside inputs that control the selection of the IR, BYPASS_REGISTER, or any other register that is selected for serial access between its scan input (SI) and scan output (SO) terminals;

The DAP controller should contain one or more broadside inputs that enable parallel-capture, serial-shift, or parallel-update actions for the register that has been selected for serial access between its SI and SO terminals;

All mode select inputs to the DAP should be treated as level-sensitive signals that are acted upon during the rising or falling edge of TCK as specified in the next two rules.

All serial and parallel capture actions into the IR, BYPASS_REGISTER, or any other user-defined DAP register preferably take place on the rising of the TCK All parallel-update actions of the instruction register or any other user-defined DAP register should take place on the falling edge of TCK.

The target signal 902 (comprising two bits, Target_1 and Target_2) allow selection of one of the four registers illustrated in the P1500 test circuit block 900 of FIG. 9.

Figure 11:
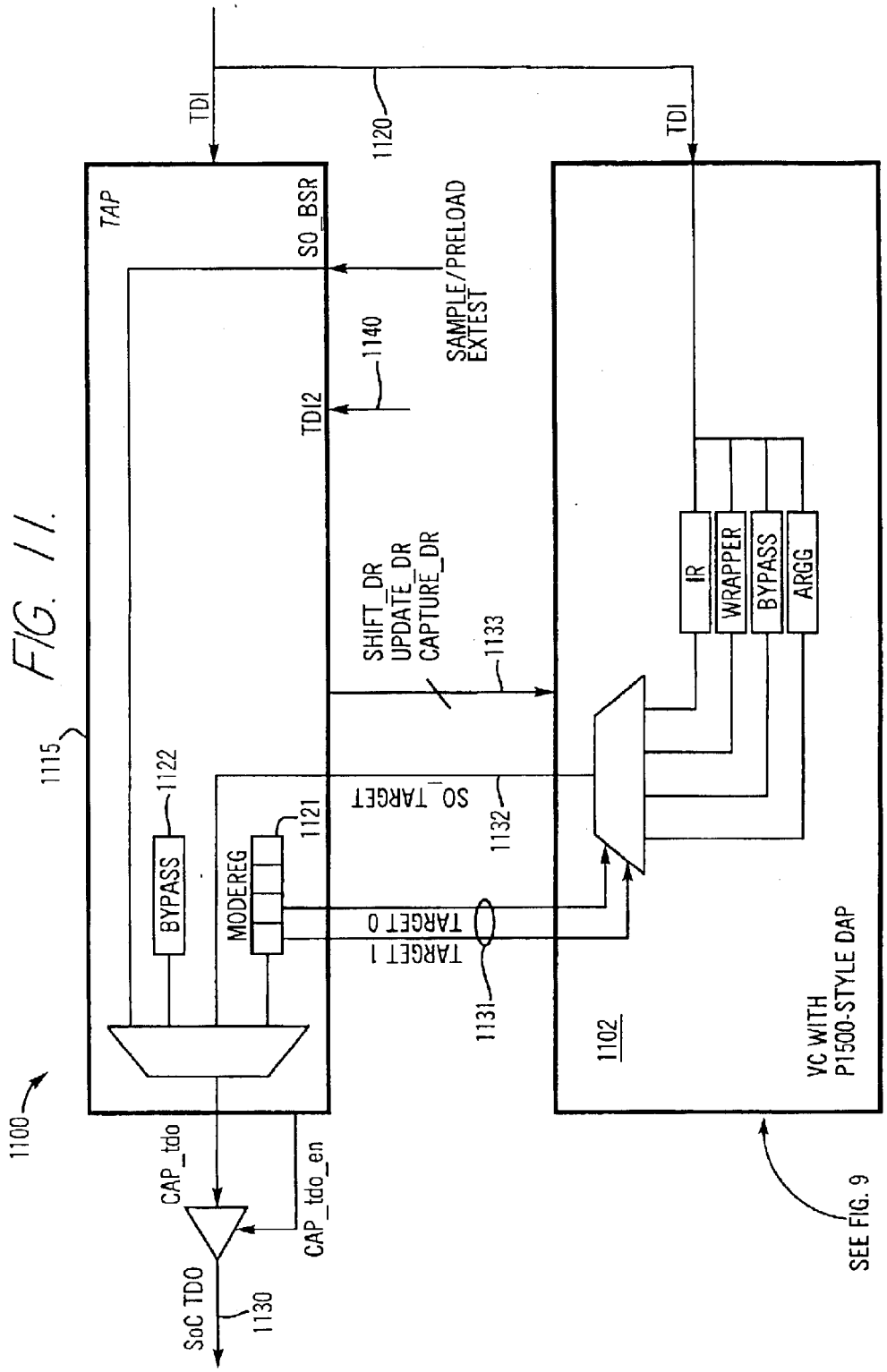
FIG. 11 is a diagram illustrating one technique for converting a P1500-type DAP controller to a socket access port (SAP) that is useful in facilitating hierarchical test control in various embodiments described herein.

FIG. 11 is a diagram illustrating one technique for converting a P1500-type design access port (DAP) controller to a socket access port (SAP) that is useful in facilitating hierarchical test control as previously described herein. As shown in FIG. 11, a DAP controller 1102 (such as the one shown in, e.g., FIG. 9) is connected to a test access port circuit block 1115. The test access port circuit block 1115 shares a common Test Data Input (TDI) signal 1120 with the DAP controller 1102. The scan output (SO) signal 1132 of the DAP controller 1102 is fed to the test access port circuit block 1115. The test access port circuit block 1115 includes a mode register 1121 and a bypass register 1122, the functions of which are analogous to the previously described registers of the same name. Two bits of the mode register 1121 are provided as Target0 and Target 1 signals 1131 to the test access port circuit block 1115. A secondary test Data Input (TDI2) signal 1140 is provided for hierarchical test functionality, and serves the purpose previously described herein. A Test Data Output (TDO) signal 1130 is output from the test access port circuit block 1115.

While various embodiments have been described herein with reference to specific types of circuits or elements, it will be appreciated by those skilled in the art that a variety of other types of circuits or elements may be used providing similar functionality. Therefore, the invention is not to be confined to the specific circuits or elements shown in the examples herein. In addition, while various embodiments have been described with respect to the IEEE 1149.1 standard and specific signal types relevant thereto (e.g., Test Data Input, Test Data Output, Test Clock, Test Reset, etc.), the principles described herein may be used in connection with other test protocols as well.

Additional details about multi-block chip design and design-for-test techniques are described in U.S. Provisional Patent Application Ser. No. 60/176,879 filed Jan. 18, 2000, hereby incorporated by reference as if set forth fully herein. Also, additional details regarding hierarchical test design circuits may be found in B. Dervisoglu and J. Swamy, *A Novel Approach for Designing a Hierarchical Test Access Controller for Embedded Core Designs in an SoC Environment*, 4$^{th}$ International Workshop of Testing Embedded Core-based System-Chips, 1.4-1, May 3–4, 2000, Montreal, TECS'00, hereby incorporated by reference as if set forth fully herein.

While preferred embodiments of the invention have been described herein, many variations are possible which remain within the concept and scope of the invention. Such variations would become clear to one of ordinary skill in the art after inspection of the specification and drawings. The invention is not to be restricted except within the spirit and scope of any appended claims.

Appearing below are computer instructions and accompanying comments written in Verilog® hardware description language for implementing a preferred embodiment of a hierarchical test control circuit.

```
/*Hierarchical TAP Controller that can also link to a P1500-style controller*/
/*The Hierarchical TAP controller has the following Register structure*/
/*IR Register, 4 bits. Opcodes are*/
/*              0000 = EXTEST,*/
/*              0001 = SAMPLE_PRELOAD,*/
/*              0010 = SET_MODE,*/
/*              0011 = SEL_TARGET*/
/*              1111 = BYPASS, reserved, plus all undefined opcodes also map onto BYPASS*/
/*BYPASS Register, 1 bit*/
/*MODE Register, 4 bits. Bit definitions are*/
/*TARGET[1], TARGET[0], TME_bit, TMD_bit*/
/*Where TARGET[1:0] is sent out to select 1 out of 4 possible registers in a P1500-style TAP Controller*/
/*P1500 controller is assumed to have WIR, BYPASS, BOUNDARY and INTERNAL registers*/
/*They are selected (inside the target, by two signals, TARGET[1:0]*/
/*They also receive_clock TARGET and update_TARGET as clocks*/
/*so_TARGET is the TDO from the selected TARGET register*/
/*TARGET registers are accessed by first executing SET_MODE to select the TARGET register*/
/*Then, SEL_TARGET is executed which accesses (Capture_DR, Shift_DR, Update_DR) the selected*/
/*TARGET register. Serial-data return from that register is received through so_TARGET*/
/*States TLR (active-low) and RTI, CAPTURE_DR, SHIFT_DR, UPDATE_DR are externally available*/
/*Local TMS is blocked (TMS = 0) if TME input = 0, i.e. Compliance-Enable condition*/
/*For hierarchical-TAP access, TMS, TCK and TDI are routed to all TAP's*/
/*TRSTN is received at the chip-level TAP. TRL from that one goes to TRSTN of next-level TAP*/
/*Hierarchical TAP uses TME, TMI, TMO and TMD signals plus the DATAIN from the active TAP*/
/*Present-level TMO (Test Mode Output) goes to next-level TME (Test Mode Enable)*/
/*Present-level TMD (Test Mode Disable) goes to previous-level TMI (Test Mode Input)*/
/*To access next-level TAP, first the MODE_REG is loaded to set the TME bit*/
/*Nothing happens until RTI state is entered. Then, local TMS is blocked and TMO is asserted*/
/*TMO from this TAP is is received as TME by the next-level TAP which becomes then enabled*/
/*Control is returned back from next-level TAP which uses MODE_REG to set TMD bit*/
/*Nothing happens until RTI state is entered. Then next-level TAP's local TMS is blocked*/
/*This TAP receives TMD from next-level at its TMI input and enables its TMS plus deasserts TMO*/
```

```
/*Then, present-level TAP should first load MODE_REG to reset the TME bit and then continue its actions*/
/*Note that TMO or TMD are not generated (even if the appropriate MODE_REG bit is set) until the FSM*/
/*enters its RTI state. This allows setting the TME_bit and then loading another instruction (e.g. EXTEST)*,/
/*which may be used to isolate the present-level block, before passing control to the next-level.*/
/*To achieve this, SW must be careful not to let the present-level TAP pass through the RTI state,*/
/*while loading EXTEST instruction, until it is time to relinquish control to the next-level*/
/*TLR (active-low) from present-level TAP is received as TRSTN by next-level TAP so that*/
/*when present-level TAP is reset all others below it are also reset*/
/*Note that after being reset, disabled TAP's move to RTI state (since local TMS = 0)*/
/*This should be okey*/
module TAP)
        TCK, TMS, TDI, TRSTN, TDO,
        clock_BSR, update_BSR,mode_BSR, so_BSR,
        TARGET clock_TARGET, update_TARGET, so_TARGET,
        TME, TMI, TMO, TMD, DATAIN,
        TLR, RTI, CAPTURE_DR, SHIFT_DR, UPDATE_DR);
input TCK;                  /*Test clock*/
input TMS,                  /*Test Mode Select*/
input TDI;                  /*Test Data Input*/
input TRSTN;                /*Test Reset_Negative, Test Reset Input*/
output TDO;                 /*Test Data Output*/
output clock_BSR:           /*Clocking BSR for Capture_DR and Shift_DR */
output update_BSR;          /*Clocking BSR for Update_DR*/
output mode_BSR;            /*Mode inputs for BSR cells*/
input so_BSR;               /*Serial output from BSR, to be routed to TDO*/
output TARGET [1:0];        /*2-bit TARGET identifier*/
                            /*00 -> TARGET_BYPASS */
                            /*01 -> TARGET_BOUNDARY_SCAN*/
                            /*10 -> TARGET_INTERNAL_SCAN*/
                            /*11 -> TARGET_IR (WIR)*/
output clock_TARGET:        /*Clocking TARGET for Capture_DR & Shift_DR*/
output update_TARGET;       /*Clocking TARGET for Update_DR*/
input so_TARGET;            /*Serial output from TARGET, to be routed to TDO*/
input TME;                  /*Test Mode Enable, Compliance-Enable for TAP*/
input TMI;                  /*Test Mode Input, receives TMD from next-level TAP*/
output TMO;                 /*Test Mode Output, drives TME of next-level TAP*/
output TMD;                 /*Test Mode Disable, drives TMI of previous-level TAP*/
Input DATAIN;               /*Input from next-level hierarchical TAP's SO, to be routed to TDO*/
output TLR:                 /*Test-Logic-Reset from TAP FSM*/
output RTI;                 /*Run-Test-Idle from TAP FSM*/
output CAPTURE_DR;          /*Capture_dr from TAP FSM*/
output SHIFT_DR;            /*Shift_dr from TAP FSM*/
output UPDATE_DR;           /*Update_dr from TAP FSM*/
reg TCK, TMS, TDI, TRSTN, TDO;
reg clock_BSR, update_BSR, so_BSR, mode_BSR;
reg TARGET[1:0], clock_TARGET, update_TARGET, so_TARGET;
reg TME, TMI, TMO, TME, DATAIN;
reg TLR, RTI, CAPTURE_DR, SHIFT_DR, UPDATE_DR;
reg exit1_DR,exit1_IR;
reg capture_IR, shift_IR, update_IR;
reg FSM[3:0];
reg MY_TMS;
reg next_FSM [3:0];
/*TAP is inactive if its TME = 0 or if asserts TMO or TMD and does not receive TMI)*/
reg ACTIVE;
always begin
/*Set the ACTIVE signal*/
    if(TME == 1'b1 and (TMI == 1'b1 or (TMO == 1'b0 and TMD == 1'bO))
    then ACTIVE = 1'b1 else ACTIVE = 1'b0;
/*MY_TMS is gated by ACTIVE*/
    MY_TMS = TMS & ACTIVE;
/*TAP FSM responds to TMS and TCK (rising-edge)*/
    if(~TRSTN) then FSM[3:0] = 4'b0000
    else
    case FSM[3:0] of
    4'b0000: if(~MY_TMS) then next_FSM = 4'b0001 else next_FSM = 4'b0000);   /*TLR*/
    4'b0001: if(~MY_TMS) then next_FSM = 4'b0001 else next_FSM = 4'b0010);   /*RTI*/
    4'b0010: if(~MY_TMS) then next_FSM = 4'b0011 else next_FSM = 4'b1001);   /*DR_scan*/
    4'b0011: if(~MY_TMS) then next_FSM = 4'b0100 else next_FSM = 4'b0101);   /*CAPTURE_DR
    4'b0100: if(~MY_TMS) then next_FSM = 4'b0100 else next_FSM = 4'b0101);   /*SHIFT_DR*/
    4'b0101: if(~MY_TMS) then next_FSM = 4'b0110 else next_FSM = 4'b1000);   /*exit1_DR*/
    4'b0110: if(~MY_TMS) then next_FSM = 4'b0110 else next_FSM = 4'b0111);   /*pause_DR*/
    4'b0111: if(~MY_TMS) then next_FSM = 4'b0100 else next_FSM = 4'b1000);   /*exit2_DR*/
    4'b1000: if(~MY_TMS) then next_FSM = 4'b0001 else next_FSM = 4'b0010);   /*UPDATE_DR*/
    4'b1001: if(~MY_TMS) then next_FSM = 4'b1010 else next_FSM = 4'b0000);   /*IR_scan*/
    4'b1010: if(~MY_TMS) then next_FSM = 4'b1011 else next_FSM = 4'b1100);   /*capture_IR*/
    4'b1011: if(~MY_TMS) then next_ESM = 4'b1011 else next_FSM = 4'b1100);   /*shift_IR*/
    4'b1100: if(~MY_TMS) then next_FSM = 4'b1101 else next_FSM = 4'b1111);   /*exit1_IR*/
    4'b1101: if(~MY_TMS) then next_FSM = 4'b1101 else next_FSM = 4'b1110);   /*pause_IR*/
```

```
        4'b1110: if(~MY_TMS) then next_FSM = 4'b1011 else next_FSM = 4'b1111);  /*exit2_IR*/
        4'b1111: if(~MY_TMS) then next_FSM = 4'b0001 else next_FSM = 4'b0010);  /*update_IR*/
        endcase;
    @posedge (TCK)
    begin
        FSM = next_FSM
    end;
/*Add a unit of delay for correct simulation*/
        #1;
/*Generate new state encodings*/
/*TLR should be active low*/
            if FSM == 4'b0000 then TLR = 1'b0 else TLR = 1'b 1;
            if FSM == 4'b0001 then RTI = 1'b1 else RTI =1'b 0;
            if FSM == 4'b0011 then CAPTURE_DR = 1'b 1 else CAPTURE_DR = 1'b 0;
            if FSM == 4'b0100 then SHIFT_DR = 1'b 1 else SHIFT_DR = 1'b 0;
            if FSM == 4'b0101 then exit1_DR = 1'b 1 else exit1_DR = 1'b 0;
            if FSM == 4'b1000 then UPDATE_DR =0 1'b 1 else UPDATE_DR =1'b 0;
            if FSM == 4'b1010 then CAPTURE_IR = 1'b 1 else CAPTURE_IR = 1'b 0;
            if FSM == 4'b1100 then exit1_IR = 1'b 1 else exit1_IR = 1'b 0;
            if FSM == 4'b1011 then shift_IR = 1'b 1 else shift_IR = 1'b 0;
            if FSM == 4'b1111 then update_IR = 1'b 1 else update_IR = 1'b 0;
end;
/*Operate the JR Register*/
reg IR_shift_stage [3:0]; IR [3:0];
always begin
    @ posedge (TCK)
    begin
        if (capture_IR == 1'b1) then IR_shift_stage = 4'b0001;
        if (shift_IR == 1'b1) then IR_shift_stage = {TDI, IR_shift_stage[3:1]};
    end
    @negedge (TCK) if (update_IR == 1'b1) the IR = IR_shift_stage;
end;
/*Decode the current instruction*/
reg SAMPLE_PRELOAD, EXTEST, BYPASS, SET_MODE, SEL_TARGET
always begin
    if(IR = 4'b0000) then EXTEST =1'b1 else EXTEST 1'b0;
    if(IR = 4'b0001) then SAMPLE_PRELOAD = 1'b1 else SAMPLE_PRELOAD = 1'b0;
    if(IR = 4'b0010) then SET_MODE = 1'b1 else SET_MODE = 1'b0;
    if(IR = 4'b0011) then SEL_TARGET = 1'b1 else SEL_TARGET = 1'b0;
    if((EXTEST == 1'b0) and
        (SAMPLE_PRELOAD 1'b0) and
        (SET_MODE == 1'b0) and
        (SEL_TARGET == 1'b0)) then BYPASS = 1'b1 else BYPASS = 1'b0;
/*Set the Mode bit to control the BSR data functions*/
/*Mode = 1 allows the BSR to control I/O pins, Mode = 0 allows normal I/O operations*/
    if(EXTEST == 1'b1) then mode_BSR = 1'b1 else mode_BSR 1'b0;
end;
/*Operate the BYPASS Register*/
reg BYPASS_REG
always begin
    @posedge (TCK)
        if (BYPASS == 1'b1) then if (SHIFT_DR == 1'b1) then BYPASS_REG = TDI;
    @negedge (TCK)
/*Clear the BYPASS register if in RTI)*/
        if(FSM == 1'b0000) then BYPASS_REG = 1'b0;
end;
/*Operate the MODE Register*/
reg MODE_REG_shift_stage [3:0], MODE_REG [3:0];
reg TME_bit, TMD_bit;
always begin
    @posedge (TCK)
    begin
        if(SET_MODE == 1'b1)
        then begin
            if (CAPTURE_DR == 1'b1)
            then MODE_REG_shift_stage = MODE_REG;
            if (SHIFT_DR == 1'b1)
            then MOD_REG_shift_stage = {TDI, MODE_REG_shift_stage[3:1]};
        end;
    end
    @negedge (TCK)
    begin
        if(SET_MODE == 1'b1)
        then begin
            if(UPDATE_DR == 1'b1) then MODE_REG ==MODE_REG_shift_stage;
/*Do not allow setting the TME_bit if TMD_bit is set*/
            if(MODE_REG[0] == 1'b1) then MODE_REG[1] ==1'b0;
/*If TMI = 1, then complete the handshake and clear the TME_bit position*/
            if(TMI == 1'b1) then MODE_REG[1] = 1'b0;
```

-continued

```
/*If TME = 0, then complete the handshake and clear the TMD_bit position.*/
            if(TME == 1'b0) then MODE_REG[0] = 1'b0;
            end;
      end;
      TARGET = MODE_REG[3:2];
      TME_bit = MODE_REG[1];
      TMD_bit = MODE_REG[0];
end;
/*Generate the BSR and TARGET clocking*/
reg clock_BSR, update_BSR;
reg clock_TARGET, update_TARGET;
always begin
/*Generate these clocks only if this TAP is active*/
      if (I_AM_ACTIVE)
          then begin
              if((EXTEST == 1'b1) or (SAMPLE_PRELOAD == 1'b1))
              then if ((CAPTURE_DR == 1'b1) or (SHIFT_DR == 1'b1))
                 then clock_BSR = 1'b1 else clock_BSR = 1'b0;
              if (SEL_TARGET ==1'b1)
              then if ((CAPTURE_DR == 1'b1) or (SHIFT_DR == 1'b1))
                 then clock_TARGET = 1'b1 else clock_TARGET = 1'b0;
              if ((EXTEST == 1'b1) or (SAMPLE_PRELOAD == 1'b1))
              then if (UPDATE_DR == 1'b1)
                 then update_BSR = 1'b1 else update_BSR = 1'b0;
              if(SEL_TARGET == 1'b1)
              then if (UPDATE_DR == 1'b1)
                 then update_TARGET = 1'b1 else update_TARGET = 1'b0;
          end;
end,
/*Select and drive the TDO bit*/
reg TDO_internal;
always begin
      if (shift_IR) then TDO_internal = IR[0];
      else begin
          if(SHIFT_DR == 1'b1)
              then begin
                  if((EXTEST ==1'b1) or
                    (SAMPLE_PRELOAD == 1'b1)) then TDO_internal = so_BSR;
                  if (BYPASS == 1'b1) then TDO internal = BYPASS_REG;
                  if (SET_MODE == 1'b1) then TDO_internal = MODE_REG_shift_stage[0];
                  if (SEL_MODE == 1'b1) then TDO_internal = so_TARGET;
              end;
      end;
/*TDO out*/
/*If this TAP is disabled, it will send forward the DATAIN from next-level TAP*/
      if(TMO == 1'b1) then TDO_internal = DATAIN;
      @negedge (TCK)
          TDO = TDO internal;
/*Set TDO to Hi_Z if not in SHIFT_DR or SHIFT_IR or (exit1_DR or exit1_IR) and TCK = 1*/
      if(~(SHIFT_DR | shift_IR | TCK & (exit1_DR | exit1_IR)) then TDO = 1'bz;
end;
/*Logic for the TMO and TMD outputs*/
always begin
/*Generate TMO if TME_bit is set in the MODE_REG and FSM is in RTI state*/
      TMO = TME & TME_bit & RTI;
/*Generate TMD if TMD_bit is set in the MODE_REG and TSM is in RTI state*/
      TMD = TME & TMD_bit & RTI;
end;
endmodule;
```

What is claimed is:

1. A hierarchical test control network for a chip design, comprising:
a plurality of test control circuit blocks in a hierarchical structure having a plurality of hierarchical levels, said test control circuit blocks comprising
a top-level test control circuit block having a chip access port (CAP) controller; and
a plurality of lower-level test control circuit blocks below the top-level control circuit block, one or more of said lower-level test control circuit blocks at each of said hierarchical levels, at least one of said lower-level test control circuit blocks connected to said top-level test control circuit block, each of said lower-level test control circuit blocks comprising a socket access port (SAP) controller, wherein at least one hierarchical level comprises at least two of the plurality of test control circuit blocks connected together;
wherein test operation is transferred downward and upwards within said hierarchical structure by communicating from each test control circuit block to the test control circuit block at the immediately higher or immediately lower hierarchical level in said hierarchical structure.

2. The hierarchical test control network of claim 1 in which the at least two of the plurality of test control circuit blocks connected together are in a chain configuration.

3. The hierarchical test control network of claim 1 wherein said hierarchical structure is organized in a plurality of tiers, and wherein the lower-level test control circuit blocks at one or more of said tiers in the hierarchical structure are connected in a serial chain.

4. The hierarchical test control network of claim 1 wherein said hierarchical structure is organized in a plurality of tiers, wherein the lower-level test control circuit blocks at one or more of the tiers in said hierarchical structure are connected in a serial chain, and wherein one or more of said lower-level test control circuit blocks are connected in said serial chain at the same tier of said hierarchical network.

5. The hierarchical test control network of claim 1, wherein each of said lower-level test control circuit blocks is connected to a different virtual circuit block for controlling testing thereof.

6. The hierarchical test control network of claim 1, wherein each of said lower-level test control circuit blocks comprises a test mode select input port, a test data input port, and a test data output port.

7. The hierarchical test control network of claim 6, wherein each of said lower-level test control circuit blocks comprises a test access port state controller for controlling the receipt or transmission of information from or to the test mode select input port, the test data input port, and the test data output port.

8. The hierarchical test control network of claim 1, wherein all of the lower-level test control circuit blocks connected at the same hierarchical level share a common test reset signal, a common test mode select signal, and a common clock signal.

9. The hierarchical test control network of claim 8, wherein all of the lower-level test control circuit blocks connected at the same hierarchical level, but not necessarily the lowest hierarchical level, collectively output a common test mode data output signal comprising a logical OR of individual test mode data output signals output from each of the lower-level test control circuit blocks connected at the same hierarchical level.

10. The hierarchical test control network of claim 9, wherein each of the lower-level test control circuit blocks connected at the same hierarchical level receives separate test mode data input signals from lower-level test control circuit blocks at an immediately lower hierarchical level, and outputs separate test mode enable output signals to the lower-level test control circuit blocks at the immediately lower hierarchical level.

11. The hierarchical test control network of claim 1, wherein all of the lower-level test control circuit blocks of the hierarchical test control network are functionally identical.

12. The hierarchical test control network of claim 1, wherein all of the lower-level test control circuit blocks are structurally identical.

13. The hierarchical test control network of claim 1, wherein the top level test control block is an interface between the interior and the exterior of the chip.

14. The hierarchical test control network of claim 1, wherein the top level test control circuit block is connected to each lower level test control circuit block.

15. The hierarchical test control network of claim 1, wherein the hierarchical structure includes:
the top level,
a first lower level below the first lower level.

16. The hierarchical test control network of claim 15, wherein the top level test control circuit block is connected to one or more first lower level test control circuit blocks, and one or more first lower level test control circuit blocks are connected to one or more second lower level test control circuit blocks.

17. The hierarchical test control network of claim 15, wherein the control of test operation is transferred between the top level and the first lower level by communicating between the top level test control circuit block and at least one first lower level test control circuit block.

18. The hierarchical test control network of claim 15, wherein the control of test operation is transferred between the first lower level and the second lower level by communicating between a first lower level test control circuit block and a second lower level test control circuit block.

19. The hierarchical test control network of claim 15, wherein the top-level test control circuit block and a first lower level test control circuit block communicate with each other, and
a first lower level test control circuit block and a second lower level test control circuit block communicate with each other.

20. The hierarchical test control network of claim 15, wherein two or more first lower level test control circuit blocks are connected in series.

21. The hierarchical test control network of claim 20, wherein a test data output of a first test control circuit block at the first lower level is a test data input of a second test control circuit block at the first lower level.

22. The hierarchical test control network of claim 15, wherein two or more test control circuit blocks at second lower level are connected in series.

23. The hierarchical test control network of claim 22, wherein a test data output of a first test control circuit block at the second lower level is a test data input of a second test control circuit block at the second lower level.

24. The hierarchical test control network of claim 15, wherein a higher level test control circuit block transfers control of test operation to an immediately lower level test control circuit block by setting a mode register in the test control circuit block at the immediately lower level.

25. The hierarchical test control network of claim 15, wherein a lower level test control circuit block transfers control of test operation to an immediately higher level test control circuit block by sending a message to the higher level test control circuit block that originally transferred control to the lower level test control circuit block.

26. The hierarchical test control network of claim 15, wherein a test data output of a lower level test control circuit block is connected to a data input to a higher level test control circuit block.

27. The hierarchical test control circuit of claim 26, wherein the test data output of a lower level test control circuit block is connected to a data input to an immediately higher level control circuit block.

28. The hierarchical test control circuit of claim 26, wherein the test data output of a lower level test control circuit block is provided as a data input to the top level test control circuit block.

29. A hierarchical test control network for an integrated circuit, comprising:
a plurality of test control circuit blocks arranged in a hierarchical structure having a plurality of hierarchical levels, each of said test control circuit blocks comprising a first test data input port, a second test data input port, and a test data output port, at least one of said test control circuit blocks at a lower level of the hierarchical structure being connected to a chip access port at the top level of the hierarchical structure;
a common test mode select signal connected to all of said test control circuit blocks;
a common test reset signal connected to all of said test control circuit blocks; and a common test clock signal connected to all of said test control circuit blocks;

wherein test control circuit blocks at the same hierarchical level each receive at their second test data input port a shared test data output signal from the test data output port of a test control circuit block at the immediately higher hierarchical level, said test control circuit blocks at said same hierarchical level connected together.

30. The hierarchical test control network of claim 29, wherein said test control circuit blocks comprise:

a top-level test control circuit block having a chip access port (CAP) controller connected to said chip access port; and a plurality of lower-level test control circuit blocks, one or more of said lower-level test control circuit blocks at each of said hierarchical levels, at least one of said lower-level test control circuit blocks connected to said top-level test control circuit block, each of said lower-level test control circuit blocks comprising a socket access port (SAP) controller;

wherein test operation is transferred downward and upwards within said hierarchical structure by communicating from each test control circuit block to the test control circuit block at the immediately higher or immediately lower hierarchical level in said hierarchical structure.

31. The hierarchical test control network of claim 29 in which said test control circuit blocks at said same hierarchical level connected together forming a composite access port.

32. The hierarchical test control network of claim 29, wherein the hierarchical structure includes a top level, wherein the at least one of said test control circuit blocks connected to the chip access port is at the top level;

a first lower level below the top level; and a second lower level below the first lower level.

33. A hierarchical test control network for an integrated circuit, comprising:

a plurality of test control circuit blocks arranged in a hierarchical structure having a plurality of hierarchical levels, each of said test control circuit blocks comprising a first test data input port, a second test data input port, and a test data output port, wherein at least one of said test control circuit blocks is connected to a chip access port at the top hierarchical level of the hierarchical structure, and wherein test control circuit blocks below the top hierarchical level and at the same hierarchical level each receive at their second test data input port a common test data output signal from the test data output port of a test control circuit block at the immediately higher hierarchical level, said test control circuit blocks at said same hierarchical level connected together;

a top-level test mode select signal connected to at least one of said test control circuit blocks at the top hierarchical level; and a test mode select output signal connected from each test control circuit block, except test control circuit blocks at the lowest hierarchical level, to test control circuit blocks at the immediately lower hierarchical level.

34. The hierarchical test control network of claim 33, further comprising:

a common test reset signal connected to all of said test control circuit blocks; and a common test clock signal connected to all of said test control circuit blocks.

35. The hierarchical test control network of claim 33, wherein said test control circuit blocks comprise:

a top-level test control circuit block having a chip access port (CAP) controller connected to said chip access port; and a plurality of lower-level test control circuit blocks, one or more of said lower-level test control circuit blocks at each of said hierarchical levels, at least one of said lower-level test control circuit blocks connected to said top-level test control circuit block, each of said lower-level test control circuit blocks comprising a socket access port (SAP) controller;

wherein test operation is transferred downward and upwards within said hierarchical structure by communicating from each test control circuit block to the test control circuit block at the immediately higher or immediately lower hierarchical level in said hierarchical structure.

36. The hierarchical test control network of claim 33, wherein said test mode select output signal is generated by a combination of a received test mode select signal and a signal representing a test mode enable logical state.

37. The hierarchical test control network of claim 33 in which said test control circuit blocks at said same hierarchical level connected together forming a composite access port.

* * * * *